United States Patent
Han et al.

(10) Patent No.: US 11,043,247 B2
(45) Date of Patent: *Jun. 22, 2021

(54) MEMORY CARD

(71) Applicant: SAMSUNG ELECTRONICS CO., LTD., Suwon-si (KR)

(72) Inventors: Seok-Jae Han, Seongnam-si (KR); Il-Mok Kang, Suwon-si (KR); Ki-Woong Yoo, Jeonju-si (KR); In-jae Lee, Hwaseong-si (KR); Gwang-Man Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/514,364

(22) Filed: Jul. 17, 2019

(65) Prior Publication Data

US 2019/0341082 A1 Nov. 7, 2019

Related U.S. Application Data

(63) Continuation of application No. 16/000,399, filed on Jun. 5, 2018, now Pat. No. 10,403,329, which is a (Continued)

(30) Foreign Application Priority Data

Jul. 2, 2014 (KR) .......................... 10-2014-0082710
Aug. 12, 2014 (KR) .......................... 10-2014-0104173

(51) Int. Cl.
*G11C 5/14* (2006.01)
*G06K 19/077* (2006.01)
(Continued)

(52) U.S. Cl.
CPC .......... *G11C 5/14* (2013.01); *G06K 19/07732* (2013.01); *G06K 19/07743* (2013.01);
(Continued)

(58) Field of Classification Search
CPC .. G11C 5/14; G11C 5/06; G11C 5/063; G06K 19/07732
(Continued)

(56) References Cited

U.S. PATENT DOCUMENTS 4,849,596 A * 7/1989 Riordan ............... B23K 11/163
219/56.22
5,059,143 A * 10/1991 Grabbe ............... H01R 13/187
439/840
(Continued)

FOREIGN PATENT DOCUMENTS

CN 1823341 A 8/2006
CN 102473245 A 5/2012
(Continued)

OTHER PUBLICATIONS

Communication dated Apr. 3, 2019, from the State Intellectual Property Office of People's Republic of China in counterpart Application No. 201580046437.1.
(Continued)

*Primary Examiner* — Alexander Gilman
(74) *Attorney, Agent, or Firm* — Sughrue Mion, PLLC

(57) ABSTRACT

A memory card and an electronic system including the memory card. The memory card includes: a substrate having two pairs of edges, in which the edges of each pair face each other; a plurality of first row terminals that are arranged adjacent to an edge at an insertion side of the substrate and include a first voltage power terminal; a plurality of second row terminals that are spaced farther apart from the edge at the insertion side than the plurality of first row terminals and
(Continued)

include a power terminal of a second voltage. According to the memory card, efficient use of an area may be maximized and an electrically stable power supply may be provided.

18 Claims, 22 Drawing Sheets

Related U.S. Application Data continuation of application No. 15/323,582, filed as application No. PCT/KR2015/006751 on Jul. 1, 2015, now Pat. No. 10,037,784.

(51) Int. Cl.
| | |
|---|---|
| G11C 5/06 | (2006.01) |
| G11C 7/10 | (2006.01) |
| G11C 7/22 | (2006.01) |
| H01R 12/73 | (2011.01) |
| H01R 13/66 | (2006.01) |

(52) U.S. Cl.
CPC ............... *G11C 5/06* (2013.01); *G11C 5/063* (2013.01); *G11C 7/10* (2013.01); *G11C 7/22* (2013.01); *H01R 12/73* (2013.01); *H01R 13/6683* (2013.01)

(58) Field of Classification Search
USPC .......................................................... 439/68
See application file for complete search history.

(56) References Cited

U.S. PATENT DOCUMENTS

| | | | | |
|---|---|---|---|---|
| 5,470,256 A * | 11/1995 | Waldock | ............ | B65H 75/36 |
| | | | | 102/202.12 |
| 6,159,055 A * | 12/2000 | Satitpunwaycha | | ............... |
| | | | | H01L 21/6833 |
| | | | | 439/700 |
| 6,525,265 B1 * | 2/2003 | Leijon | .................. | H01R 4/68 |
| | | | | 174/15.5 |
| 6,648,279 B1 * | 11/2003 | Malin | .................. | H02G 7/053 |
| | | | | 174/44 |
| 6,896,523 B2 | 5/2005 | Nishizawa et al. | | |
| D507,795 S * | 7/2005 | Yamada | ................ | D14/436 |
| 6,939,182 B1 * | 9/2005 | Wen | ..................... | G06K 13/06 |
| | | | | 439/55 |
| 6,945,465 B2 * | 9/2005 | Nishizawa | ........ | G06K 19/07732 |
| | | | | 235/492 |
| D510,579 S * | 10/2005 | Yamada | ................ | D14/436 |
| D510,935 S * | 10/2005 | Yamada | ................ | D14/436 |
| 7,200,930 B2 * | 4/2007 | Khandros | ......... | B23K 20/004 |
| | | | | 29/860 |
| 7,218,528 B2 * | 5/2007 | Chen | ................. | H05K 5/0282 |
| | | | | 235/487 |
| 7,291,903 B2 * | 11/2007 | Nishizawa | ......... | G06K 7/0021 |
| | | | | 235/492 |
| 7,384,271 B1 * | 6/2008 | Mickievicz | ........ | H01R 12/714 |
| | | | | 439/66 |
| 7,413,153 B1 * | 8/2008 | Ghormley | ........... | F16L 3/085 |
| | | | | 174/172 |
| 7,706,204 B2 * | 4/2010 | Choi | ................ | G11C 16/30 |
| | | | | 365/149 |
| 7,908,506 B2 * | 3/2011 | Chien | .................. | G06F 1/08 |
| | | | | 375/130 |
| 7,946,500 B2 * | 5/2011 | Nishizawa | ........ | G06K 19/005 |
| | | | | 235/441 |
| 8,110,434 B2 * | 2/2012 | Okada | ................ | H05K 1/0256 |
| | | | | 257/E21.5 |
| 8,274,141 B2 * | 9/2012 | Nishiyama | ............ | H01L 25/18 |
| | | | | 257/686 |
| 8,974,401 B2 * | 3/2015 | Taylor | .............. | A61M 25/002 |
| | | | | 600/585 |
| D730,911 S * | 6/2015 | Lim | ............................ | D14/436 |
| D773,467 S * | 12/2016 | Cho | ............................ | D14/436 |
| D783,622 S * | 4/2017 | Lee | ............................. | D14/436 |
| 10,106,369 B2 * | 10/2018 | Makrinos | ............... | B65H 75/36 |
| 10,374,342 B2 * | 8/2019 | Koh | ........................ | H01R 12/714 |
| 2004/0055013 A1 * | 3/2004 | Ishioka | ................... | H04H 40/18 |
| | | | | 725/89 |
| 2004/0193928 A1 * | 9/2004 | Shuto | ...................... | G06F 1/305 |
| | | | | 713/300 |
| 2004/0259291 A1 | 12/2004 | Takiar | | |
| 2005/0013106 A1 * | 1/2005 | Takiar | ................... | G06K 19/077 |
| | | | | 361/679.31 |
| 2005/0281010 A1 * | 12/2005 | Wang | ...................... | H05K 1/117 |
| | | | | 361/752 |
| 2007/0155046 A1 | 7/2007 | Takiar et al. | | |
| 2007/0257116 A1 * | 11/2007 | Hsieh | ..................... | G06K 19/07 |
| | | | | 235/492 |
| 2007/0259567 A1 * | 11/2007 | Chen | ..................... | G06K 19/077 |
| | | | | 439/638 |
| 2007/0294440 A1 * | 12/2007 | Haku | ..................... | G06K 19/07 |
| | | | | 710/62 |
| 2008/0049392 A1 * | 2/2008 | Takiar | .................... | G06K 19/04 |
| | | | | 361/679.32 |
| 2008/0173995 A1 * | 7/2008 | Kuratomi | ............. | H01L 21/566 |
| | | | | 257/679 |
| 2009/0057417 A1 * | 3/2009 | Shinohara | ................ | G11C 5/14 |
| | | | | 235/492 |
| 2009/0132763 A1 * | 5/2009 | Miller | .................. | G06K 19/077 |
| | | | | 711/115 |
| 2009/0150610 A1 * | 6/2009 | Hsu | ...................... | H05K 5/0282 |
| | | | | 711/115 |
| 2009/0193180 A1 * | 7/2009 | Ito | ......................... | G06F 13/385 |
| | | | | 711/103 |
| 2009/0254704 A1 * | 10/2009 | Nakamura | ........... | G06F 13/409 |
| | | | | 711/115 |
| 2009/0290274 A1 * | 11/2009 | Suenaga | .......... | G06K 19/07732 |
| | | | | 361/56 |
| 2010/0172112 A1 * | 7/2010 | Okada | .............. | G06K 19/07732 |
| | | | | 361/782 |
| 2011/0021956 A1 * | 1/2011 | Shinomiya | ............. | A61H 1/005 |
| | | | | 601/5 |
| 2011/0087804 A1 * | 4/2011 | Okaue | ...................... | G06F 1/26 |
| | | | | 710/5 |
| 2011/0145465 A1 * | 6/2011 | Okada | .................. | G06F 13/409 |
| | | | | 710/301 |
| 2011/0185098 A1 * | 7/2011 | Kim | .................. | G06K 19/07743 |
| | | | | 710/301 |
| 2011/0316134 A1 * | 12/2011 | Ishii | .................... | H01L 23/3107 |
| | | | | 257/676 |
| 2012/0049378 A1 * | 3/2012 | Asada | ............... | H01L 23/3107 |
| | | | | 257/773 |
| 2012/0117315 A1 * | 5/2012 | Okada | ............. | G06K 19/07743 |
| | | | | 711/103 |
| 2014/0127947 A1 * | 5/2014 | Han | ................. | G06K 19/07739 |
| | | | | 439/630 |
| 2014/0258563 A1 * | 9/2014 | Otsuka | ................ | G06F 13/385 |
| | | | | 710/13 |
| 2015/0102847 A1 * | 4/2015 | Singh | .................... | H03K 3/0372 |
| | | | | 327/203 |
| 2016/0049742 A1 * | 2/2016 | Han | ................. | G06K 19/07743 |
| | | | | 365/185.18 |
| 2017/0148492 A1 * | 5/2017 | Han | ......................... | G11C 5/14 |

FOREIGN PATENT DOCUMENTS

| | | |
|---|---|---|
| WO | 2010/041245 A1 | 4/2010 |
| WO | 2011/010680 A1 | 1/2011 |
| WO | 2013/140376 A1 | 9/2013 |

OTHER PUBLICATIONS

Search Report dated Oct. 8, 2015, issued by the International Searching Authority in counterpart International Application No. PCT/KR2015/006751 (PCT/ISA/210).

(56) References Cited

OTHER PUBLICATIONS

Written Opinion dated Oct. 8, 2015, issued by the International Searching Authority in counterpart International Application No. PCT/KR2015/006751 (PCT/ISA/237).

* cited by examiner

MEMORY CARD

CROSS-REFERENCE TO RELATED APPLICATIONS

This application is a continuation application of U.S. patent application Ser. No. 16/000,399, filed on Jun. 5, 2018, which is a continuation application of U.S. patent application Ser. No. 15/323,582, filed on Jan. 3, 2017, which is a National Stage Entry of PCT/KR2015/006751 filed on Jul. 1, 2015, which claims the benefits of Korean Patent Application No. 10-2014-0082710, filed on Jul. 2, 2014 and Korean Patent Application No. 10-2014-0104173, filed on Aug. 12, 2014, in the Korean Intellectual Property Office, the disclosures of which are incorporated herein in their entirety by reference.

BACKGROUND

The inventive concept relates to a memory card and an electronic system including the memory card, and more particularly, to a memory card capable of maximizing efficient use of an area and providing an electrically stable power supply and an electronic system including the memory card.

As a memory card is easy to store high-capacity data and to carry, it may be widely used in mobile phones or laptop computers. A memory card varies in size according to necessity, and according to the demand for compact high-speed high-capacity memory cards, memory cards having smaller sizes, higher storage speeds, and greater storage capacities are being developed and released. Meanwhile, as memory standards with a faster storage speed are required, methods of maintaining a compact size of memory cards and enabling a stable power supply and a high-speed operation need to be examined in various aspects.

SUMMARY

The inventive concept provides a memory card capable of maximizing efficient use of an area and an electrically stable electrical power supply.

According to an aspect of the inventive concept, there is provided a memory card including: a substrate having two pairs of edges, in which the edges of each pair face each other; a plurality of first row terminals that are arranged adjacent to an edge at an insertion side of the substrate and include a first voltage power terminal for applying a first voltage; a plurality of second row terminals that are spaced farther apart from the edge at the insertion side than the plurality of first row terminals and include a second voltage power terminal for applying a second voltage, wherein a first edge from among two edges adjacent to the edge at the insertion side of the substrate extends in a direction that is substantially perpendicular to the edge at the insertion side, and a second edge facing the first edge includes an arc portion in which a passive device is provided, and a first end of the passive device is electrically connected to the second voltage power terminal.

The plurality of second row terminals may include a card detection terminal, and the card detection terminal may be electrically connected to a second end of the passive device. The card detection terminal may be adjacent to the arc portion, and the second voltage power terminal may be adjacent to the card detection terminal. The card detection terminal may be a grounded terminal. The passive device may be a capacitor.

The plurality of second row terminals may be closer to a center of the memory card than the plurality of first row terminals with respect to a direction perpendicular to the edge at the insertion side, which is a first direction.

The second voltage may be lower than the first voltage. The memory card may further include a memory controller and a non-volatile memory device. The first voltage power terminal may be configured to supply power to the non-volatile memory device, and the second voltage power terminal may be configured to supply power to the memory controller.

According to another aspect of the inventive concept, there is provided a memory card including: a substrate having two pairs of edges, in which the edges of each pair face each other; a plurality of first row terminals that are arranged adjacent to an edge at an insertion side of the substrate and include a first voltage power terminal for applying a first voltage; a plurality of second row terminals that are spaced farther apart from the edge at the insertion side than the plurality of first row terminals and include a second voltage power terminal for applying a second voltage, wherein a distance between a center of the second row terminals in a direction perpendicular to the edge at the insertion side, which is a first direction, and a center of the memory card is 20% of a length of the memory card in the first direction or less.

The second row terminals may include a pair of data input terminals and a pair of data output terminals, and the pair of data input terminals may be shielded by a pair of first ground terminals. Also, the pair of data output terminals may be shielded by a pair of second ground terminals. Also, one ground terminal may be shared by the pair of the first ground terminals and the pair of the second ground terminals.

The second row terminals further include a reference clock terminal, and the reference clock terminal may be spaced apart from the data input terminals with the first ground terminal interposed therebetween or may be spaced apart from the data output terminals with the second ground terminal interposed therebetween. The second row terminals may further include a card detection terminal disposed at a side of the reference clock terminal with a second voltage power terminal interposed therebetween. The card detection terminal may be a grounded terminal. The memory card may further include a passive device. A first end of the passive device may be connected to the card detection terminal, and a second end of the passive device may be connected to the second voltage power terminal. A front end of the second voltage power terminal toward the edge at the insertion side may be closer to the edge at the insertion side than a front end of the card detection terminal toward the edge at the insertion side.

A length of the data input terminals in the first direction may be shorter than a length of the first ground terminals in the first direction. A front end of the first ground terminals toward the edge at the insertion side may be closer to the edge at the insertion side than a front end of the data input terminals toward the edge at the insertion side.

A length of the data output terminals in the first direction may be shorter than a length of the second ground terminals in the first direction. A front end of the second ground terminals toward the edge at the insertion side may be closer to the edge at the insertion side than a front end of the data output terminals toward the edge at the insertion side.

According to another aspect of the inventive concept, there is provided a memory card including: a substrate having two pairs of edges, in which the edges of each pair face each other; a plurality of first row terminals that are arranged adjacent to an edge at an insertion side of the substrate and include a first voltage power terminal for applying a first voltage; a plurality of second row terminals that are spaced farther apart from the edge at the insertion side than the plurality of first row terminals and include a second voltage power terminal for applying a second voltage, wherein a first edge and a second edge adjacent to the edge at the insertion side are provided, and the second row terminals sequentially include, from the first edge to the second edge, a card detection terminal, the second voltage power terminal, a reference clock terminal, a first ground terminal, a pair of first data terminals, a second ground terminal, a pair of second data terminals, and a third ground terminal.

One pair from among the pair of first data terminals and the pair of second data terminals may be a pair of data input terminals, and the other pair may be a pair of data output terminals. A length of the card detection terminal in a direction perpendicular to the edge at the insertion side, which is a first direction, may be the same as a length of the second voltage power terminal. A distance between the edge at the insertion side and a front end of the card detection terminal may be the same as a distance between the edge at the insertion side and a front end of the second voltage power terminal.

A length of the card detection terminal in a direction perpendicular to the edge at the insertion side, which is a first direction, may be longer than a length of the second voltage power terminal in the first direction, and a distance between the edge at the insertion side and a front end of the card detection terminal may be the same as a distance between the edge at the insertion side and a front end of the second voltage power terminal.

A length of the card detection terminal in a direction perpendicular to the edge at the insertion side, which is a first direction, may be longer than a length of the second voltage power terminal in the first direction, and a distance between the edge at the insertion side and a front end of the card detection terminal may be shorter than a distance between the edge at the insertion side and a front end of the second voltage power terminal. A distance between the edge at the insertion side and a rear end of the card detection terminal may be greater than a distance between the edge at the insertion side and a rear end of the second voltage power terminal.

A length of the card detection terminal in a direction perpendicular to the edge at the insertion side, which is a first direction, may be shorter than a length of the second voltage power terminal in the first direction, and a distance between the edge at the insertion side and a front end of the card detection terminal may be the same as a distance between the edge at the insertion side and a front end of the second voltage power terminal.

A length of the card detection terminal in a direction perpendicular to the edge at the insertion side, which is a first direction, may be longer than a length of the second voltage power terminal in the first direction, and a distance between the edge at the insertion side and a front end of the card detection terminal may be shorter than a distance between the edge at the insertion side and a front end of the second voltage power terminal. A distance between the edge at the insertion side and a rear end of the card detection terminal may be the same as a distance between the edge at the insertion side and a rear end of the second voltage power terminal.

According to another aspect of the inventive concept, there is provided an electronic system including: a controller; an input/output unit via which data is input or output; a memory unit that is capable of storing data; an interface unit via which data is transmitted to an external device; and a bus that connects the controller, the input/output unit, the memory unit, and the interface unit to communicate with one another, wherein the memory unit includes the memory card described above.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
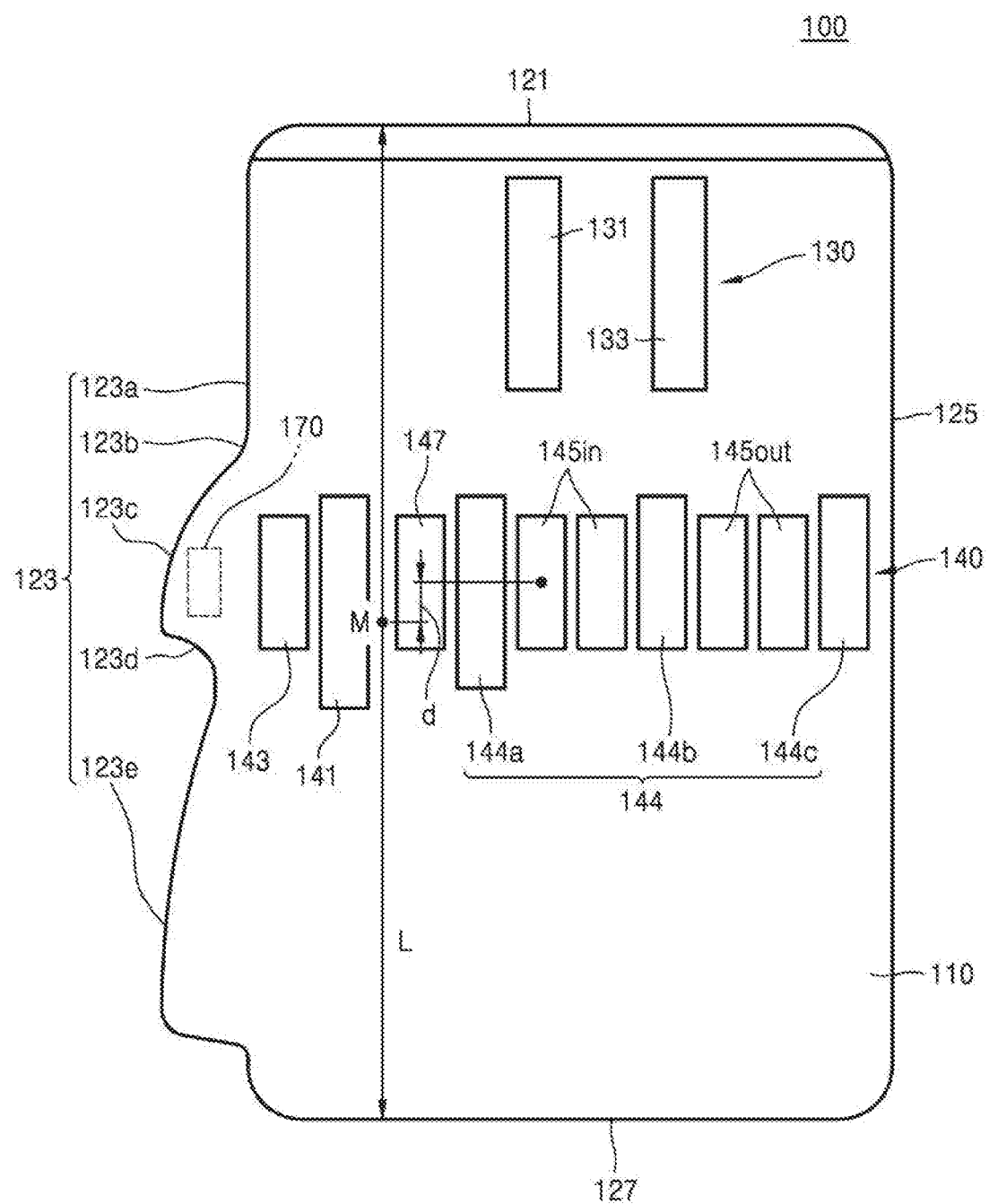
FIG. 1 is a plan view illustrating a memory card according to an embodiment of the inventive concept.

The inventive concept will now be described more fully with reference to the accompanying drawings, in which exemplary embodiments of the inventive concept are shown. The inventive concept may, however, be embodied in many different forms, and should not be construed as being limited to the embodiments set forth herein; rather, these embodiments are provided so that this disclosure will be thorough and complete, and will fully convey the concept of the inventive concept to those skilled in the art. Like reference numerals denote like elements throughout the specification. Furthermore, various elements and regions are schematically illustrated in the drawings. Thus, the inventive concept is not limited by the relative sizes or intervals illustrated in the attached drawings.

Terms including ordinal numbers such as 'first', 'second', etc. are used to describe various elements but the elements should not be defined by these terms. The terms are used only for distinguishing one element from another element. For example, without departing from the spirit and scope of the inventive concept, a first component may be referred to as a second component, or a second component may be referred to as a first component.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless defined differently, all terms used in the description including technical and scientific terms have the same meanings as generally understood by those skilled in the art. Terms commonly used and defined in dictionaries should be construed as having the same meanings as in the associated technical context of the inventive concept, and unless defined apparently in the description, these terms are not ideally or excessively construed as having formal meanings.

As used herein, the term "and/or" includes any and all combinations of one or more of the associated listed items. Expressions such as "at least one of," when preceding a list of elements, modify the entire list of elements and do not modify the individual elements of the list.

FIG. 1 is a plan view illustrating a memory card 100 according to an embodiment of the inventive concept.

Referring to FIG. 1, the memory card 100 may have two pairs of edges, in which the edges of each pair face each other. The two pairs of edges may include an edge 121 at an insertion side where the memory card 100 is inserted into a socket, a first edge 123 and a second edge 125 that adjoin the edge 121 at the insertion side, and a third edge 127 facing the edge 121 at the insertion side. In other words, one of the two pairs of edges include the edge 121 at the insertion side and the third edge 127 and the other of the two pairs of edges include the first edge 123 and the second edge 125. The edge 121 at the insertion side and the third edge 127 may be parallel to each other.

The second edge 125 may extend in a direction perpendicular to a direction in which the edge 121 at the insertion side extends. Also, the second edge 125 may extend only in a single direction. Also, the first edge 123 may have both portions that are parallel to the second edge 125 and portions that are not parallel to the second edge 125.

Corners having predetermined radii of curvature may be between the edges 121, 123, 125, and 127. The corners may have identical or different shapes.

The edge 121 at the insertion side is an edge at a side where the memory card 100 is inserted into a socket, and when the memory card 100 is inserted into the socket, the edge 121 at the insertion side enters the socket first from among the edges 121, 123, 125, and 127, and leaves the socket last from among the edges 121, 123, 125, and 127 when the memory card 100 is withdrawn from the socket. In order for the memory card 100 to easily enter the socket, a width of the edge 121 at the insertion side may be determined in consideration of a predetermined clearance.

Terminals for electrically connecting semiconductor devices in the memory card 100 and a host may be arranged adjacent to the edge 121 at the insertion side. The host may be for example, a mobile phone, a desktop computer, a laptop computer, a tablet PC, a game player, a navigation device, or a digital camera, but the inventive concept is not limited thereto. Also, an adapter for interfacing may be interposed between the memory card 100 and the host.

[Pin Arrangements]

The terminals may be arranged in two rows as illustrated in FIG. 1. That is, a plurality of first row terminals 130 and a plurality of second row terminals 140 may be arranged adjacent to the edge 121 at the insertion side of a substrate 110.

Figure 2:
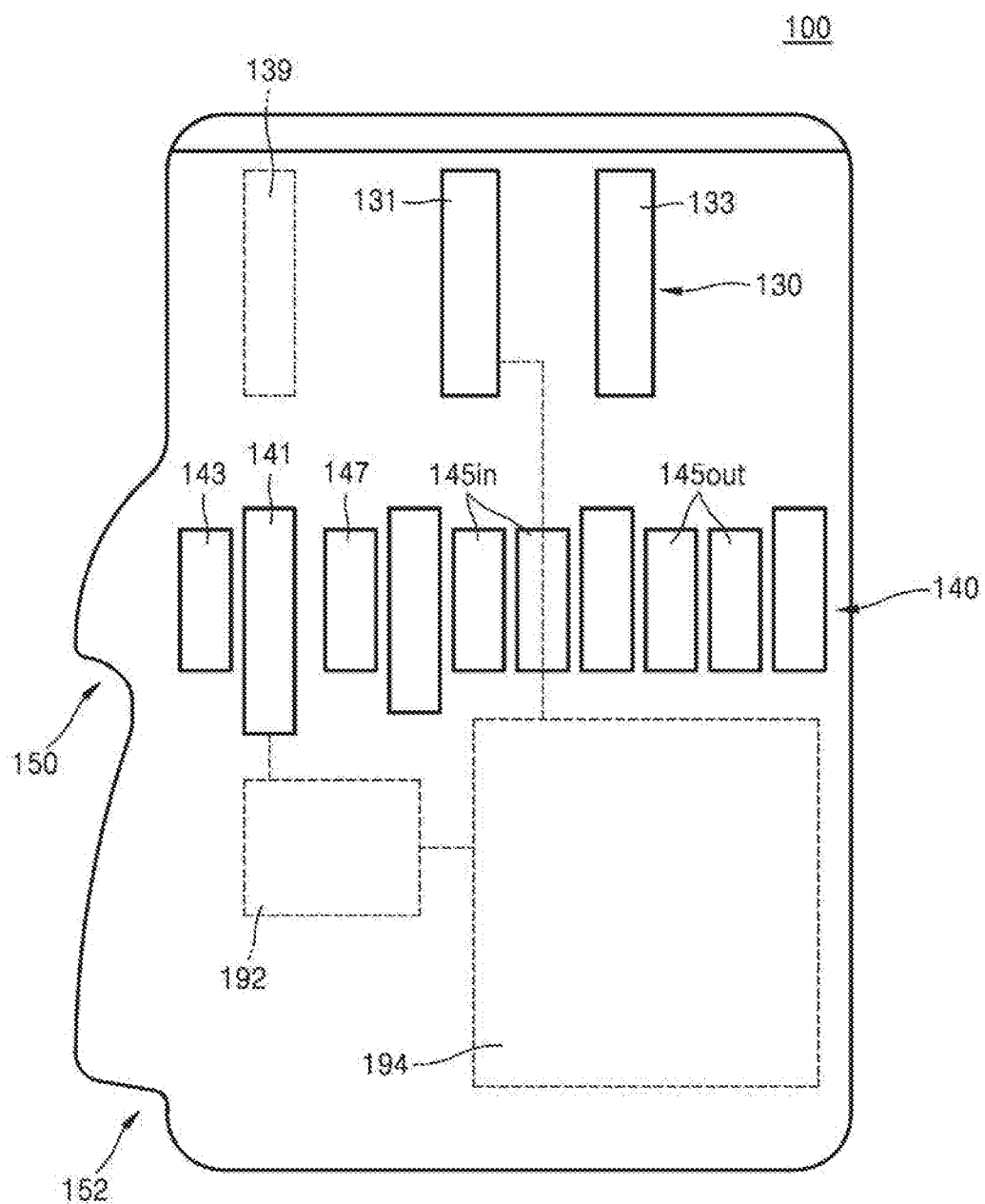
FIG. 2 is a partial perspective view illustrating a memory card and some of internal components of the memory card according to an embodiment of the inventive concept.

FIG. 2 is a partial perspective view illustrating a memory card 100 and some of internal components of the memory card 100, according to an embodiment of the inventive concept. Although one non-volatile memory device 194 is illustrated in FIG. 2, it will be obvious to one of ordinary skill in the art that two or more non-volatile memory devices may be mounted.

Referring to FIG. 2, the first row terminals 130 may include a first voltage power terminal 131 for applying a first voltage that may be, for example, between about 3.0 V and about 3.5 V. The first voltage may be supplied to semiconductor devices that operate at a low speed among semiconductor devices in the memory card 100. For example, the first voltage may be supplied to the non-volatile memory devices 194 in the memory card 100.

The second row terminals 140 may include a second voltage power terminal 141 for applying a second voltage that may be, for example, between about 1.5 V and about 2.2 V. The second voltage may be supplied to semiconductor devices that operate at a high speed among semiconductor devices in the memory card 100. For example, the second voltage may be supplied to a memory controller 192 in the memory card 100.

Although a connecting wiring between the memory controller 192 and the second voltage power terminal 141 and a connection wiring between the non-volatile memory device 194 and the first voltage power terminal 131 are illustrated, it will be obvious to one of ordinary skill in the art that wiring between respective elements is not limited thereto. The memory controller 192 and the non-volatile memory devices 194 may also be connected to other elements via wirings in various manners.

In the present embodiment, the first row terminals 130 are closer to the edge 121 at the insertion side than the second row terminals 140 are, and thus, power may be supplied to the first row terminals 130 before being supplied to the second row terminals 140. In other words, as the memory card 100 is inserted, power of the first voltage may be supplied to the non-volatile memory devices 194 in advance via the first voltage power terminal 131 included in the first row terminals 130. In addition, a ground terminal 133 is also connected to a host in advance so as to form a power circuit and a ground circuit, via which the entire memory card 100 may be operated, before power is supplied to the memory controller 192, so that an overall operation of the memory card 100 is prepared.

In addition, as the memory controller 192 operates at high speed, a considerable amount of heat may be generated, and in this case, adequate heat dissipation may be a problem. If the memory controller 192 is disposed close to the second voltage power terminal 141 as in the embodiment illustrated in FIG. 2, heat generated in the memory controller 192 may be quickly dissipated through the second voltage power terminal 141 and a card detection terminal 143.

Referring to FIG. 1 again, the first row terminals 130 may be arranged relatively closer to the edge 121 at the insertion side than the second row terminals 140 are. That is, the second row terminals 140 may be spaced apart from the edge 121 at the insertion side by a greater distance than the first row terminals 130.

Although two first row terminals 130 and ten second row terminals 140 are illustrated in FIG. 1, the number, position, shape, and size of terminals are not limited thereto and may vary according to necessity. Also, some of the first and second row terminals 130 and 140 may be coated with a solder resist (SR) layer and may not be exposed to the outside. Some of the terminals that are not exposed may be, for example, test terminals.

The first row terminals 130 and the second row terminals 140 may each include one or more ground terminals. For example, the first row terminals 130 may include a ground terminal 133.

Also, the second row terminals 140 may include ground terminals 144. Also, the second row terminals 140 may have a pair of data input terminals 145*in* and a pair of data output terminals 145*out*. Although the data input terminals 145*in* are illustrated as being disposed in a more central portion of the memory card 100 compared to the pair of data output terminals 145*out*, positions of the data input and output terminals 145*in* and 145*out* may be changed.

The data input terminals 145*in* may be electrically shielded via a pair of ground terminals 144*a* and 144*b*. Also, the data output terminals 145*out* may be electrically shielded via the pair of ground terminals 144*b* and 144*c*. Data may be input or output more stably due to the shielding.

Also, as illustrated in FIG. 1, one ground terminal 144*b* may be shared both in the pair of ground terminals 144*a* and 144*b* for shielding the data input terminals 145*in* and the pair of ground terminals 144*b* and 144*c* for shielding the data output terminals 145*out*. Selectively, a pair of ground terminals for shielding the data input terminals 145*in* and a pair of ground terminals for shielding the data output terminals 145*out* may not share a ground terminal.

The pair of the data input terminals 145*in* may have the same measurements as each other. Also, the pair of the data output terminals 145*out* may have the same measurements as each other. Also, the data input terminals 145*in* and the data output terminals 145*out* may have the same measurements as each other.

The pair of the data input terminals 145*in* may be maintained between the ground terminals 144*a* and 144*b* with respect to a direction perpendicular to the edge 121 at the insertion side (hereinafter referred to as a first direction). Also, the pair of data output terminals 145*out* may be maintained between the ground terminals 144*b* and 144*c* with respect to the first direction.

A length of the data input terminals 145*in* in the first direction may be shorter than a length of the ground terminals 144*a* and 144*b* in the first direction. In particular, front ends of the ground terminals 144*a* and 144*b* at the edge 121 at the insertion side may be closer to the edge 121 at the insertion side than front ends of the data input terminals 145*in* at the edge 121 at the insertion side.

A length of the data output terminals 145*out* in the first direction may be shorter than a length of the ground terminals 144*b* and 144*c* in the first direction. In particular, front ends of the ground terminals 144*b* and 144*c* at the edge 121 at the insertion side may be closer to the edge 121 at the insertion side than front ends of the data output terminals 145*out* at the edge 121 at the insertion side.

A distance between rear ends of the ground terminals 144*a*, 144*b*, and 144*b* opposite to the front ends thereof and the edge 121 at the insertion side may be equal to or greater than a distance between rear ends of the data input terminals 145*in* and the data output terminals 145*out* and the edge 121 at the insertion side.

The second row terminals 140 may be disposed in a center portion of or in proximity to the memory card 100. By disposing the second row terminals 140 as described above, distances from the second row terminals 140 to the memory controller 192 and to the non-volatile memory devices 194 may be reduced, and routing may also be simplified. Thus, high speed operation and convenience in terms of circuit design may be achieved.

In particular, by disposing the second voltage power terminal 141 in a center portion of or in proximity to the memory card 100, the second voltage power terminal 141 may be a relatively close distance to the memory controller 192 regardless of which portion of the memory card 100 the memory controller 192 is disposed in, and thus, a power supply path may be shortened.

For example, with respect to the first direction, a distance d between a center of the second row terminals 140 and a center M of the memory card 100 may be 20% of a length L of the memory card 100 in the first direction. The second row terminals 140 may have various lengths in the first direction, and moreover, positions of front ends and rear ends of the second row terminals 140 may not be uniform, and the center of the second row terminals 140 is defined as a center of either the data input terminals 145*in* or the data output terminals 145*out* that are closest to the edge 121 at the insertion side.

By configuring the memory card 100 as described above, a distance between the memory controller 192 and the non-volatile memory devices 194 and the data input terminals 145*in* and the data output terminals 145*out* may be minimized no matter where the memory controller 192 and the non-volatile memory devices 194 are disposed. Accordingly, not only a high-speed operation is enabled but a degree of freedom in terms of design may be secured.

Also, with respect to the first direction, the second row terminals 140 may be closer to the center M of the memory card 100 than the first row terminals 130. The first row terminals 130 may be closer to the edge 121 at the insertion side than the second row terminals 140.

The second row terminals 140 have a reference clock terminal 147. The reference clock terminal 147 may be provided with a clock signal having a frequency of, for example, about 26 MHz.

Also, the second voltage power terminal 141 may be provided beside the reference clock terminal 147. Accordingly, the reference clock terminal 147 may be electrically shielded from signal input and output of adjacent terminals, for example, the data input and output terminals 145*in* and 145*out*, via the ground terminal 144*a* and the second voltage power terminal 141, and thus a stable operation is enabled.

Also, a distance from the reference clock terminal 147 to the memory controller 192 may be minimized for a high-speed operation. A position of the memory controller 192 may be varied according to design of the memory card 100, and thus the reference clock terminal 147 may be disposed at a center of the memory card 100 as much as possible. In this regard, the reference clock terminal 147 may be disposed at a more central position of the memory card 100 than the card detection terminal 143, which will be described later, or the second voltage power terminal 141.

The card detection terminal 143 may be disposed in a lateral direction of the second voltage power terminal 141. The card detection terminal 143 is used to allow a host to determine a type of the memory card 100. In particular, the card detection terminal 143 may be electrically connected to a ground line of the memory card 100.

By using a grounded terminal as the card detection terminal 143 instead of data input and output terminals and allowing a host to receive a ground signal from a socket terminal at a position of the card detection terminal 143 so as to determine a card type, accuracy in terms of recognition of card types is remarkably increased to reduce recognition error, and moreover, a data input and output process for recognizing a card type may be omitted, thereby increasing recognition speed.

Although the card detection terminal 143 is disposed to be closest to the first edge 123 among the second row terminals 140, and the second voltage power terminal 141 is disposed along a lateral direction of the card detection terminal 143 in FIG. 1, the positions of the card detection terminal 143 and the second voltage power terminal 141 may be exchanged.

A lateral protrusion which is similar to the shape of a shark fin may be formed in a lateral direction of the second row terminals 140. Shapes of the lateral protrusion will be described in detail later.

A passive device 170 may be formed in the lateral protrusion. The passive device 170 may be, for example, at least one of a resistor, a capacitor, an inductor, a thermistor, an oscillator, a ferrite bead, an antenna, a varistor, and a crystal. However, the passive device 170 is not limited thereto and may also be other passive device.

In order to supply high-quality power, an input end of power may be grounded in parallel via a capacitor. Thus, the passive device 170 may be particularly a capacitor, and one end of the passive device 170 may be connected to the card detection terminal 143, and the other end of the passive device 170 may be connected to the second voltage power terminal 141.

Figure 3:
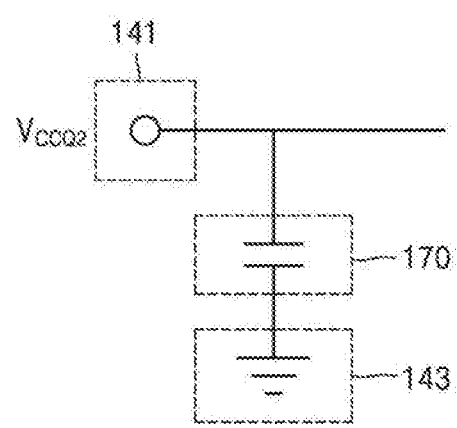
FIG. 3 is an equivalent circuit diagram illustrating a connection between a passive device, a card detection terminal, and a second voltage power terminal.

FIG. 3 is an equivalent circuit diagram illustrating a connection between the passive device 170, the card detection terminal 143, and the second voltage power terminal 141.

Referring to FIG. 3, the second voltage power terminal 141 may be connected to internal circuits to supply power of the second voltage, and may be connected to the passive device 170 which is a capacitor, in parallel. Also, the other end of the passive device 170 may be grounded.

The card detection terminal 143 which is a ground terminal used in card detection may be used in the above grounding. As routing to an additional ground end is not necessary for the grounding, the entire routing may be simplified.

Furthermore, by accommodating the passive device 170 such as a capacitor in the lateral protrusion, the entire area of the memory card 100 may be efficiently used. Also, as the card detection terminal 143 connected to one end of the passive device 170 as a ground terminal and the second voltage power terminal 141, connected to the other end of the passive device 170, are disposed adjacent to the passive device 170, routing is simplified. Moreover, as the card detection terminal 143 and the second voltage power terminal 141 are arranged at a short distance from each other, a stable supply of high-quality power is enabled.

Referring to FIG. 1 again, the second voltage power terminal 141 may be different from the card detection terminal 143 in terms of size, shape, and position.

In particular, a position of a front end of the second voltage power terminal 141 at the edge 121 at the insertion side and a position of a front end of the card detection terminal 143 at the edge 121 at the insertion side may be different. As illustrated in FIG. 1, the position of the front end of the second voltage power terminal 141 at the edge 121 at the insertion side may be closer to the edge 121 at the insertion side than the position of the front end of the card detection terminal 143 at the edge 121 at the insertion side.

If socket terminals that are at a host and connected to the plurality of the second row terminals 140 are arranged in parallel in a horizontal direction, when the memory card 100 is inserted, the second voltage power terminal 141, whose front end is closer to the edge 121 at the insertion side, first contacts the socket terminals than the card detection terminal 143.

Accordingly, power may be supplied to the memory controller 192 (see FIG. 2) in advance, and a memory card may be booted in advance before recognizing a type of the memory card at the host, thus enabling a quick operation.

Also, as illustrated in FIG. 2, no terminal is formed in the first direction of the second voltage power terminal 141. In other words, none of the first row terminals 130 are disposed in the first direction of the second voltage power terminal 141. Thus, when the memory card 100 is inserted, a socket terminal corresponding to the second voltage power terminal 141 does not contact other terminals of the memory card 100 unnecessarily, and thus, unnecessary noise in a signal pad may be prevented.

FIGS. 4A through 4E are schematic views illustrating memory cards 100a, 100b, 100c, 100d, and 100e according to embodiments of the inventive concept.

Figure 4A:
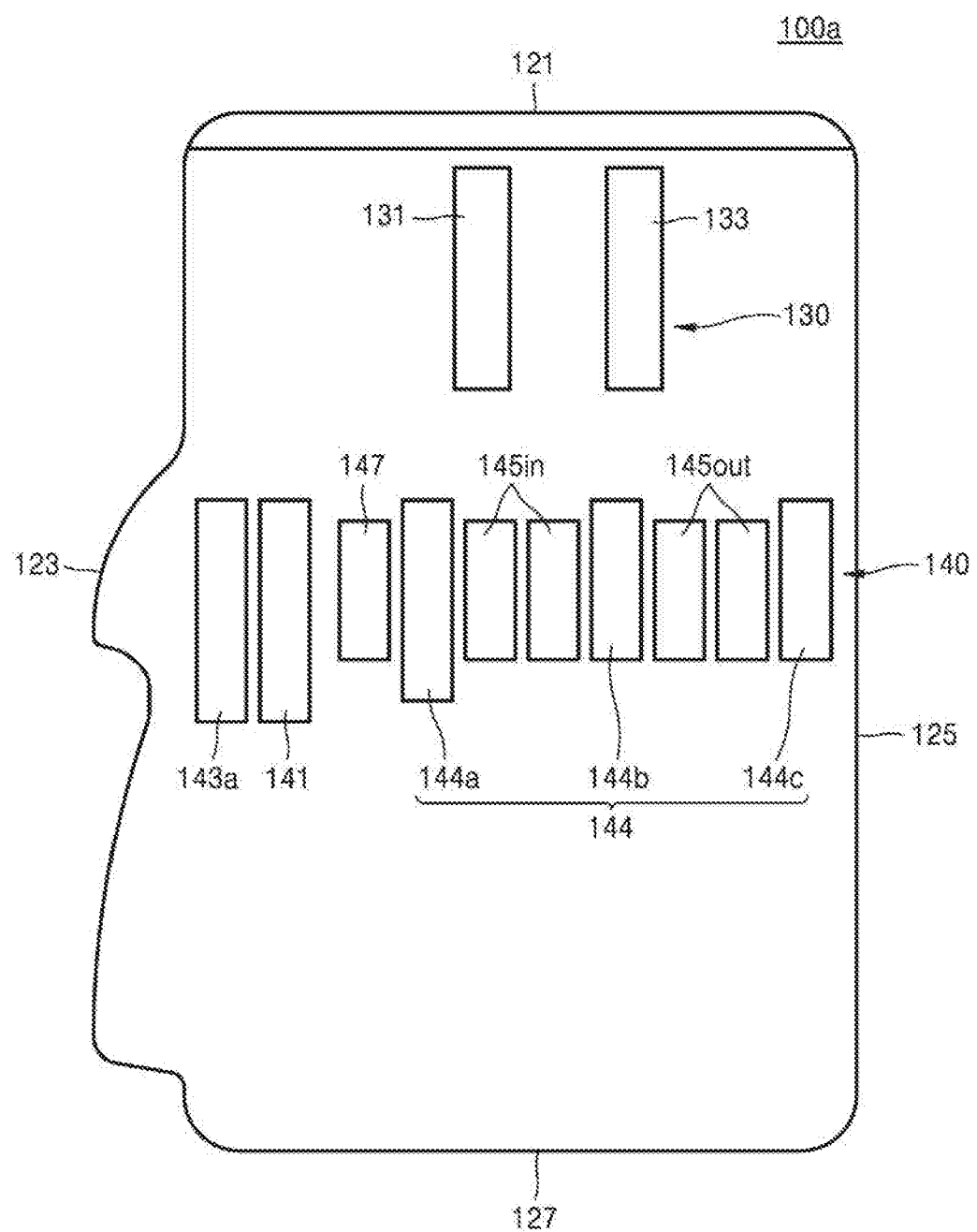
FIGS. 4A through 4E are schematic views illustrating memory cards according to embodiments of the inventive concept.

Referring to FIG. 4A, lengths of a second voltage power terminal 141 and a card detection terminal 143a in the first direction are identical. Also, positions of front ends of the second voltage power terminal 141 and the card detection terminal 143a at the edge 121 at the insertion side are the same. In other words, a distance between the edge 121 at the insertion side and the front end of the card detection terminal 143a is the same as a distance between the edge 121 at the insertion side and the front end of the second voltage power terminal 141.

When the second voltage power terminal 141 and the card detection terminal 143a are configured as illustrated in FIG. 4A, the second voltage power terminal 141 and the card detection terminal 143a may simultaneously contact socket terminals, and the card detection terminal 143a which is a ground terminal and other ground terminals 144 may simultaneously contact the socket terminals, and thus mutual interference between terminals due to noise may be minimized. Furthermore, as a rear end of the card detection terminal 143a is aligned with a rear end of the second voltage power terminal 141, overtravel, which refers to deviation of the card detection terminal 143a from a corresponding position of a socket terminal, may be minimized.

Figure 4B:
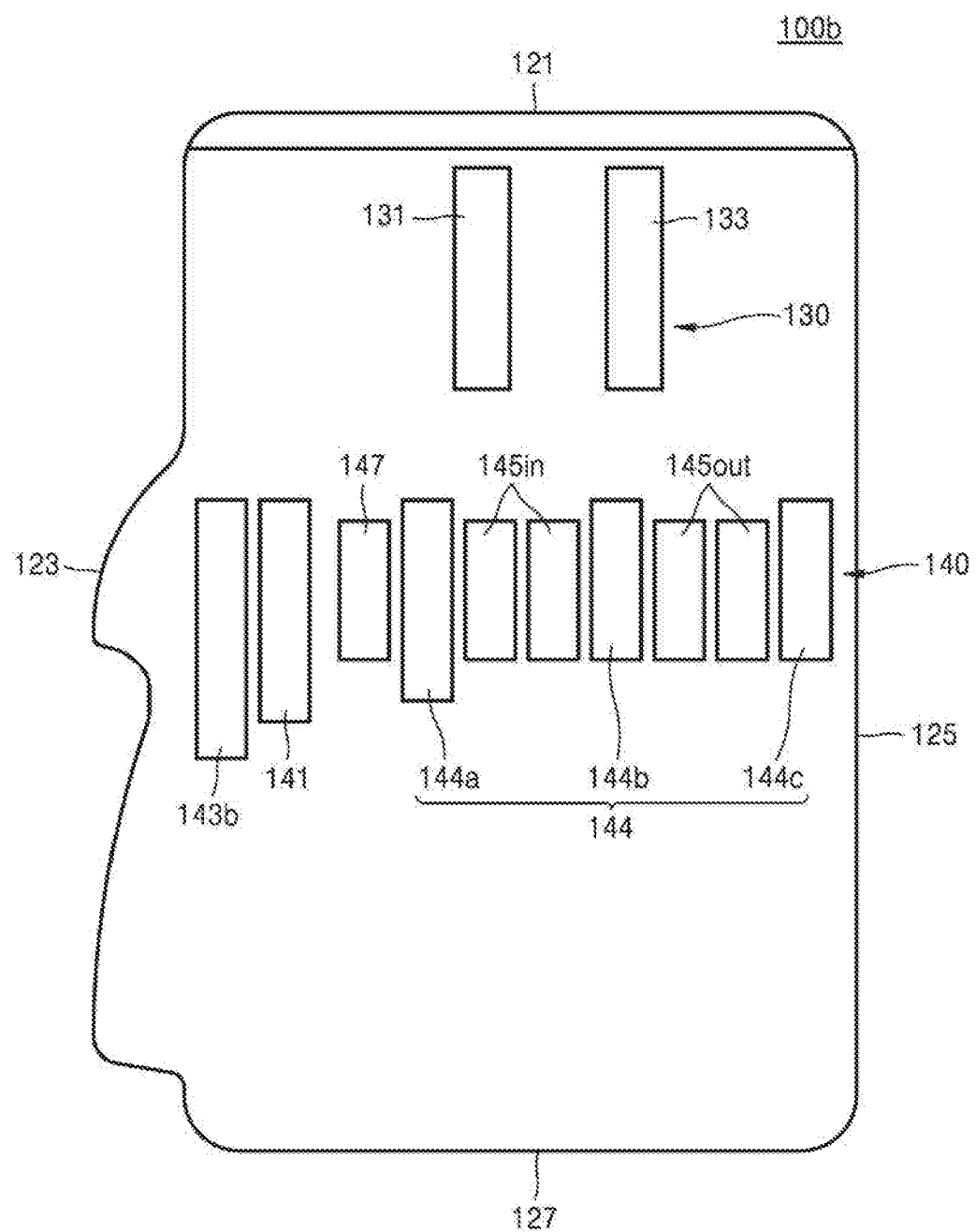

Referring to FIG. 4B, a length of a power terminal 141 of a second voltage in the first direction is greater than a length of a card detection terminal 143b in the first direction. Also, a distance between the edge 121 at the insertion side and a front end of the card detection terminal 143b is the same as a distance between the edge 121 at the insertion side and the front end of the second voltage power terminal 141.

When the second voltage power terminal 141 and the card detection terminal 143b are configured as illustrated in FIG.

4B, the second voltage power terminal 141 and the card detection terminal 143b may simultaneously contact socket terminals, and the card detection terminal 143a which is a ground terminal and other ground terminals 144 may simultaneously contact the socket terminals, and thus, mutual interference between terminals due to noise may be minimized. Furthermore, as a rear end of the card detection terminal 143b extends farther than a position of a rear end of the second voltage power terminal 141, overtravel which refers to deviation of the card detection terminal 143n from a corresponding position of a socket terminal may be further minimized.

Figure 4C:
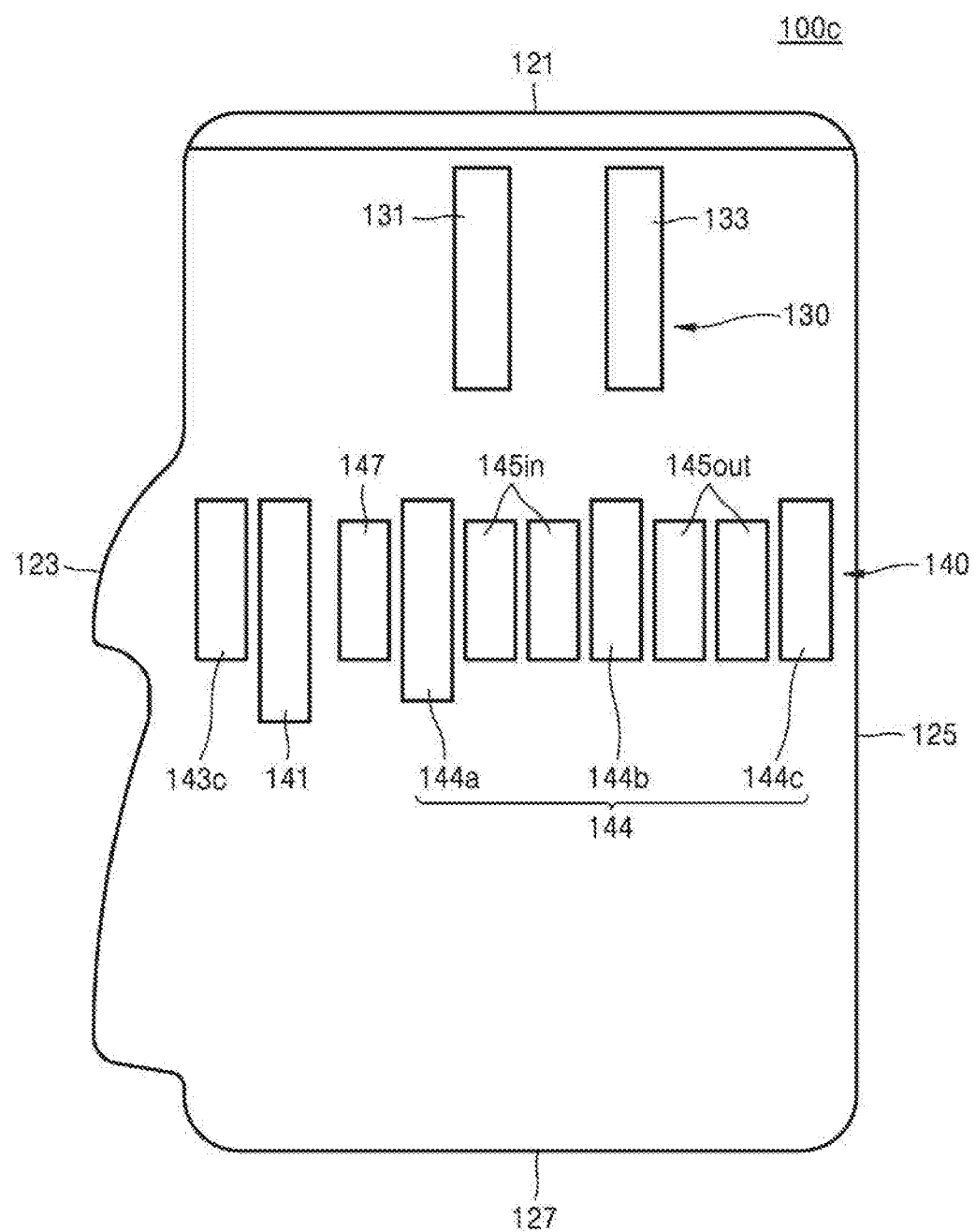

Referring to FIG. 4C, a length of a card detection terminal 143c in the first direction is shorter than a length of a second voltage power terminal 141. Also, a distance between the edge 121 at the insertion side and a front end of the card detection terminal 143c is the same as a distance between the edge 121 at the insertion side and a front end of the second voltage power terminal 141.

Also, a distance between the edge 121 at the insertion side and a rear end of the card detection terminal 143c is smaller than a distance between the edge 121 at the insertion side and a rear end of the second voltage power terminal 141.

When the second voltage power terminal 141 and the card detection terminal 143c are configured as illustrated in FIG. 4C, the second voltage power terminal 141 and the card detection terminal 143c may simultaneously contact socket terminals, and the card detection terminal 143a which is a ground terminal and other ground terminals 144 may simultaneously contact the socket terminals, and thus, mutual interference between terminals due to noise may be minimized.

Figure 4D:
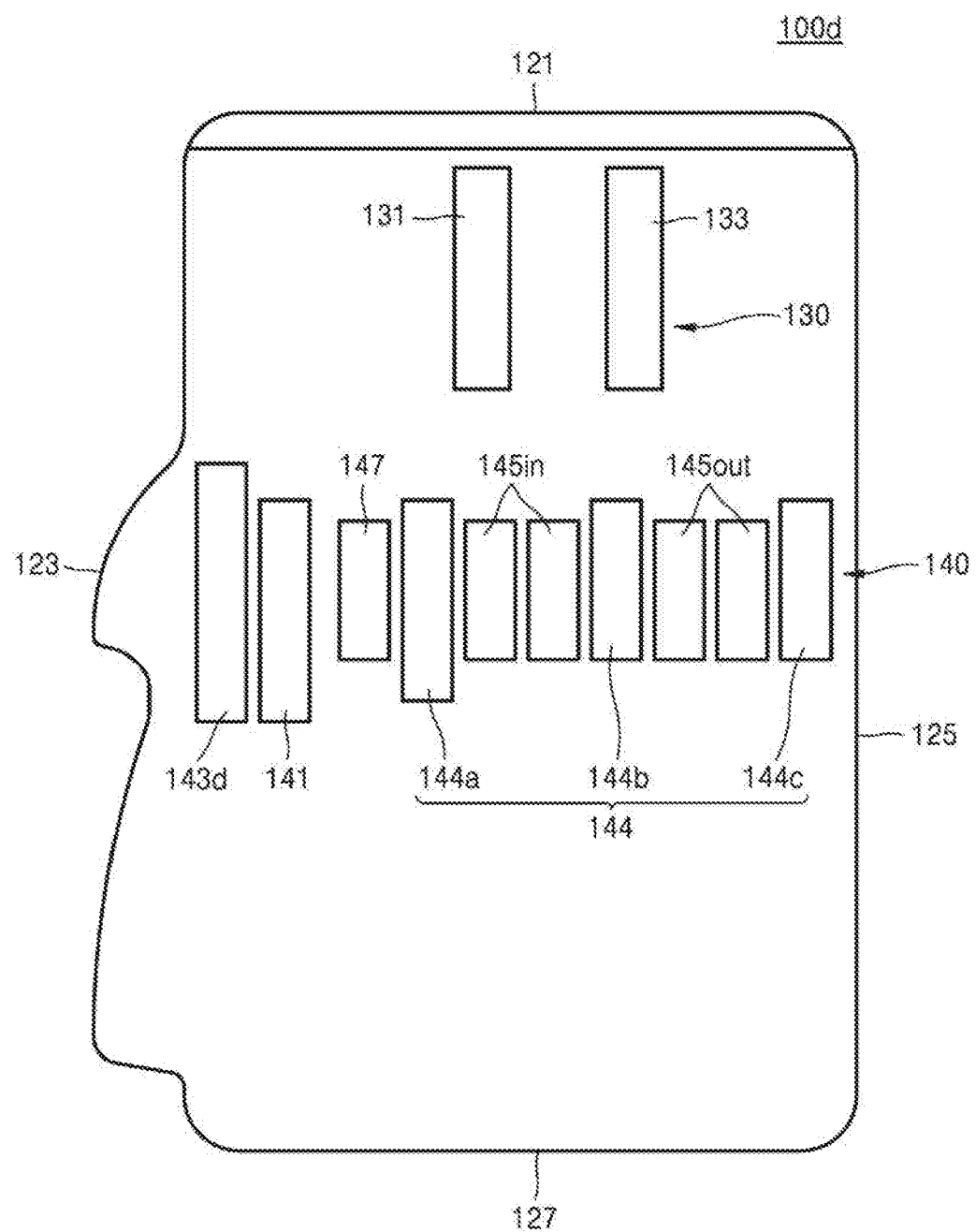

Referring to FIG. 4D, a length of a card detection terminal 143d in the first direction is longer than a length of a second voltage power terminal 141. Also, a distance between the edge 121 at the insertion side and a front end of the card detection terminal 143d is smaller than a distance between the edge 121 at the insertion side and a front end of the second voltage power terminal 141.

Also, a distance between the edge 121 at the insertion side and a rear end of the card detection terminal 143d is the same as a distance between the edge 121 at the insertion side and a rear end of the second voltage power terminal 141.

When the second voltage power terminal 141 and the card detection terminal 143d are configured as illustrated in FIG. 4D, the card detection terminal 143d may preferentially contact socket terminals so that a host may perform card recognition, thus enabling a quick response of the host.

Furthermore, as the rear end of the card detection terminal 143d is withdrawn to a position of the rear end of the second voltage power terminal 141, overtravel which refers to deviation of the card detection terminal 143d from a corresponding position of a socket terminal may be minimized.

Figure 4E:
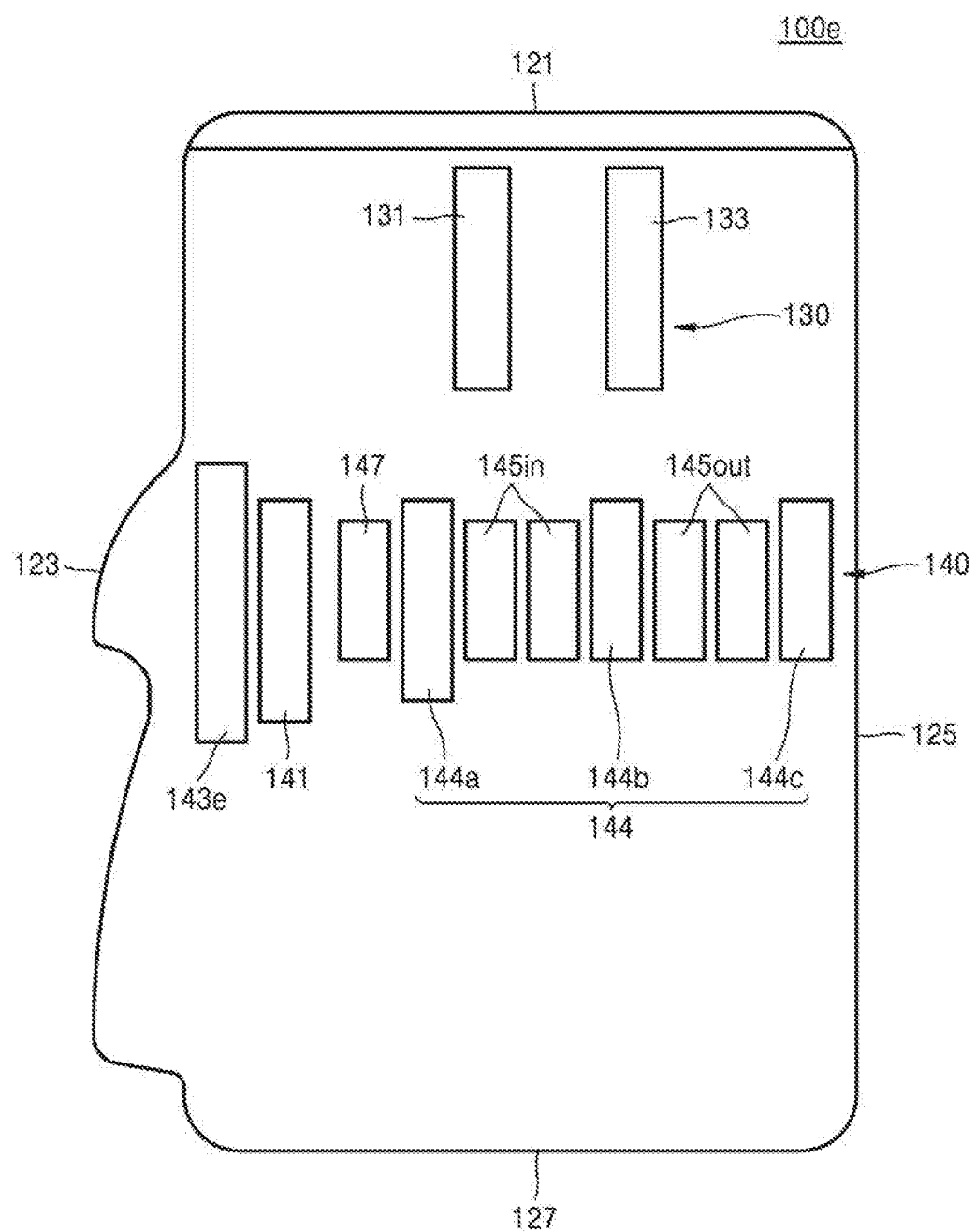

Referring to FIG. 4E, a length of the card detection terminal 143e in the first direction is longer than a length of a power terminal 141 of a second voltage. Also, a distance between the edge 121 at the insertion side and a front end of the card detection terminal 143e is smaller than a distance between the edge 121 at the insertion side and a front end of the second voltage power terminal 141.

Also, a distance between the edge 121 at the insertion side and a rear end of the card detection terminal 143e is greater than a distance between the edge 121 at the insertion side and a rear end of the second voltage power terminal 141.

When the second voltage power terminal 141 and the card detection terminal 143e are configured as illustrated in FIG. 4E, the card detection terminal 143e may preferentially contact socket terminals so that a host may perform card recognition, thus enabling a quick response of the host.

Furthermore, as the rear end of the card detection terminal 143e extends farther than a position of the rear end of the second voltage power terminal 141, overtravel which refers to deviation of the card detection terminal 143e from a corresponding position of a socket terminal may be further minimized.

As described above, various effects on the memory cards 100, 100a, 100b, 100c, 100d, and 100e may be obtained by adjusting the lengths and the positions of the respective terminals. It will be obvious to one of ordinary skill in the art to adjust the lengths, positions, and shapes of the respective terminals to obtain other effects based on the above description.

[Structure of Double Shark Fin]

Figure 5A:
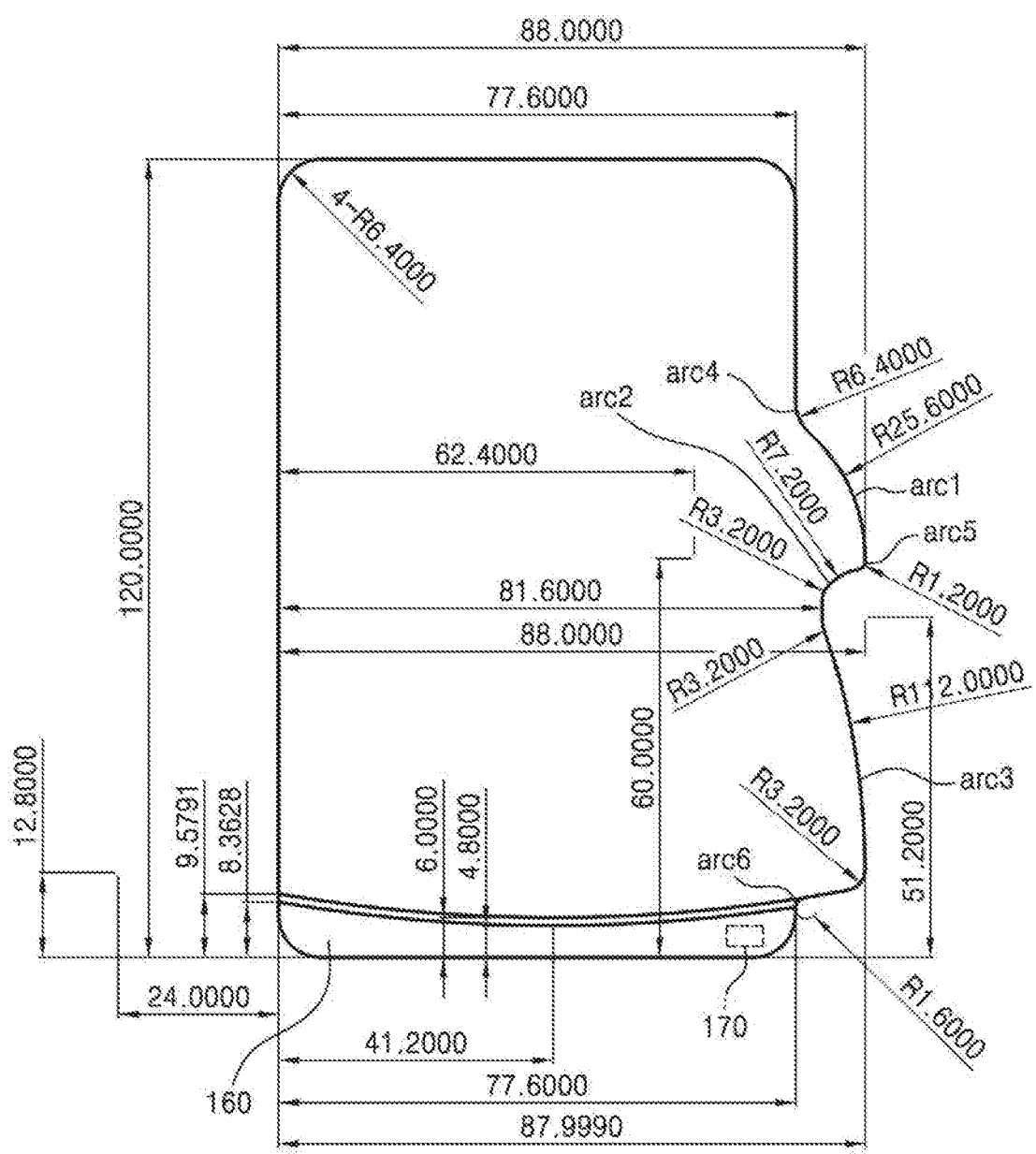
FIGS. 5A through 5C are respectively a front view, a left side view, and a rear view of a memory card according to an embodiment of the inventive concept.
Figure 5B:
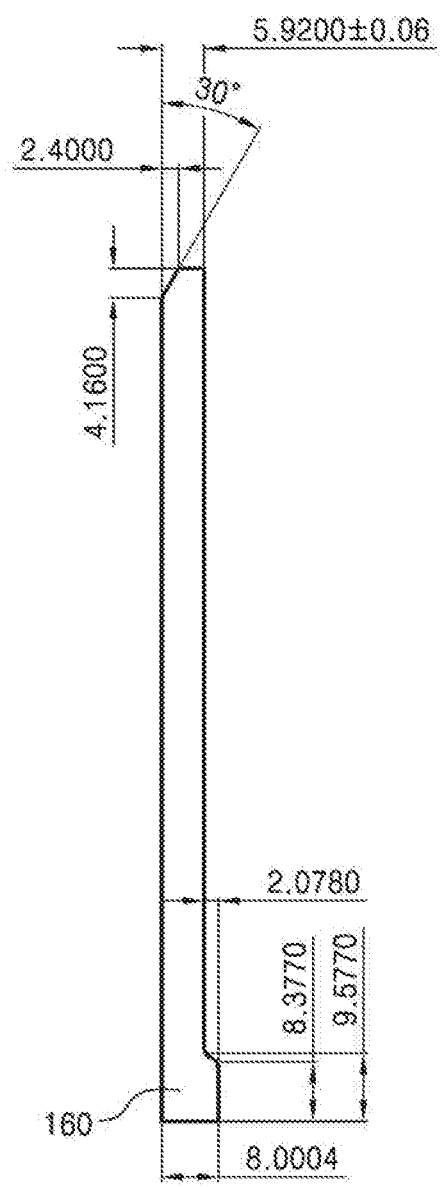
Figure 5C:
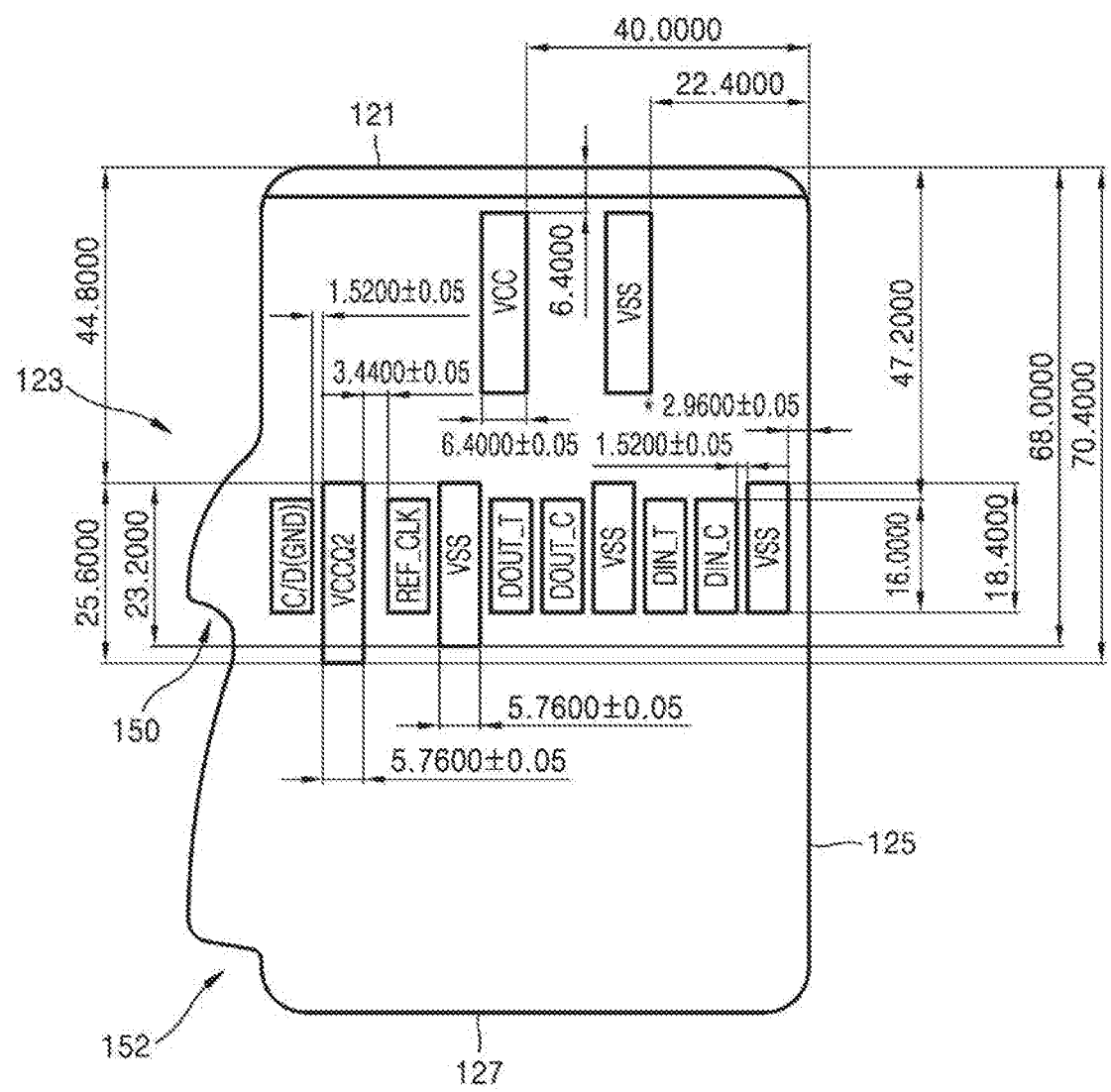
Figure 6A:
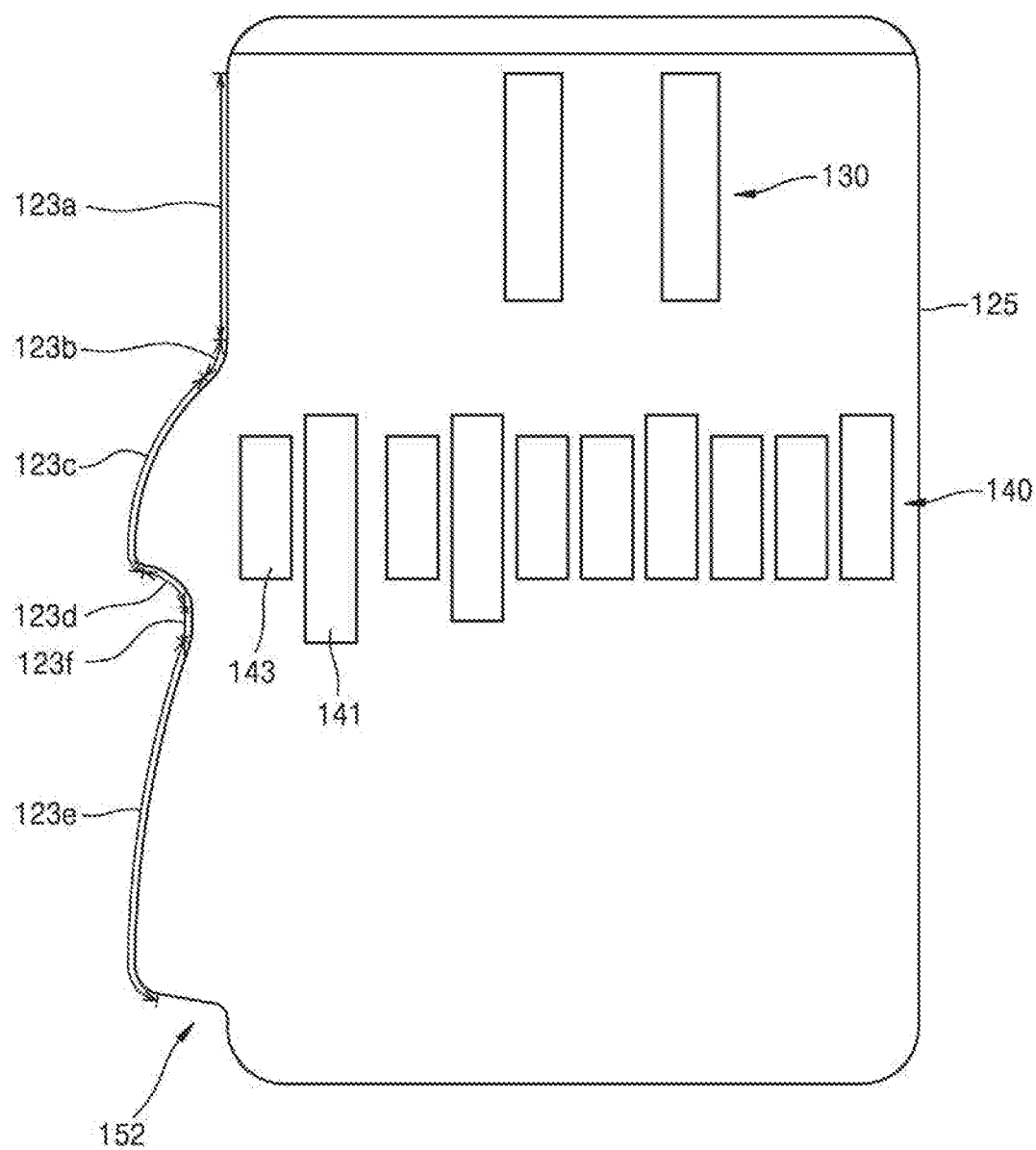
FIGS. 6A through 6C are auxiliary views illustrating a structure of the memory card in detail.
Figure 6B:
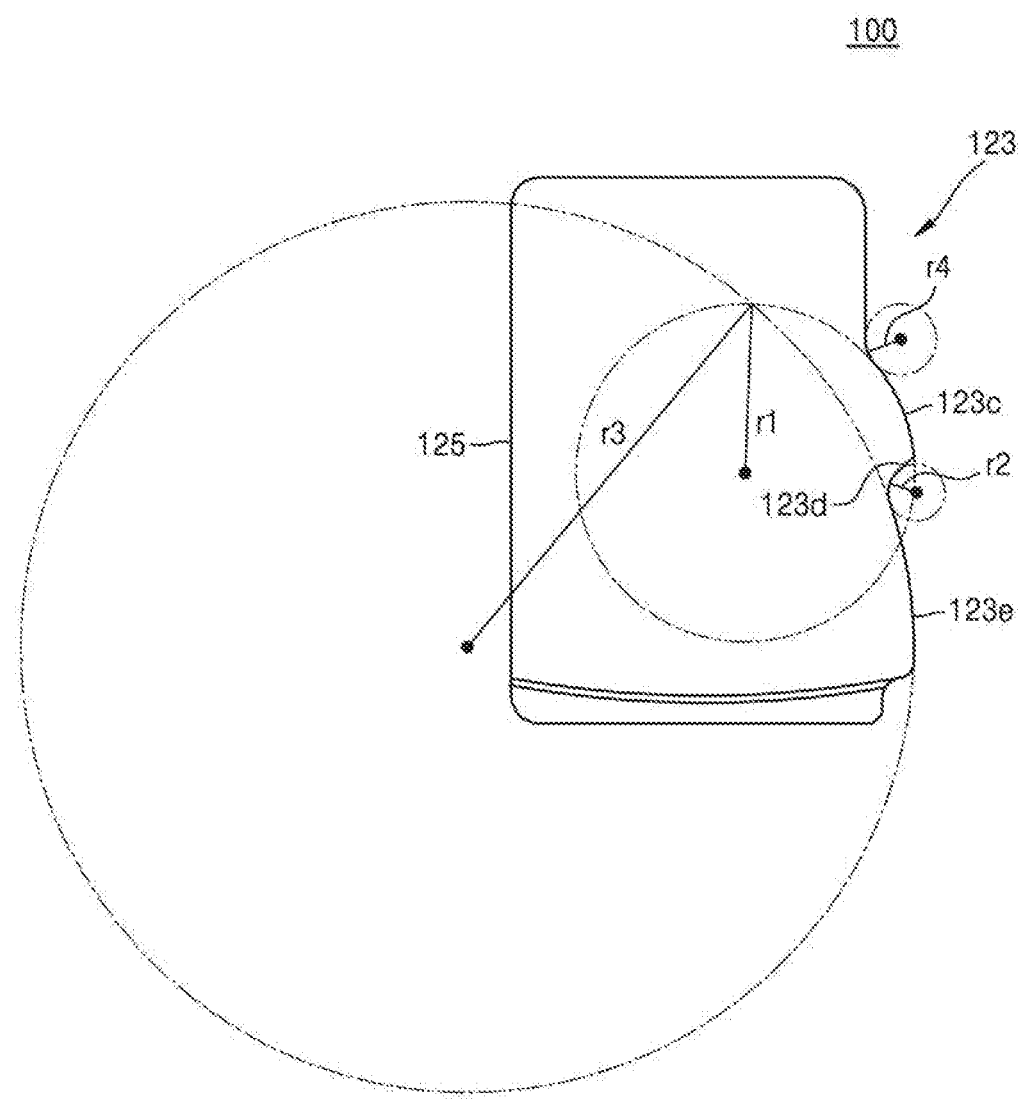
Figure 6C:
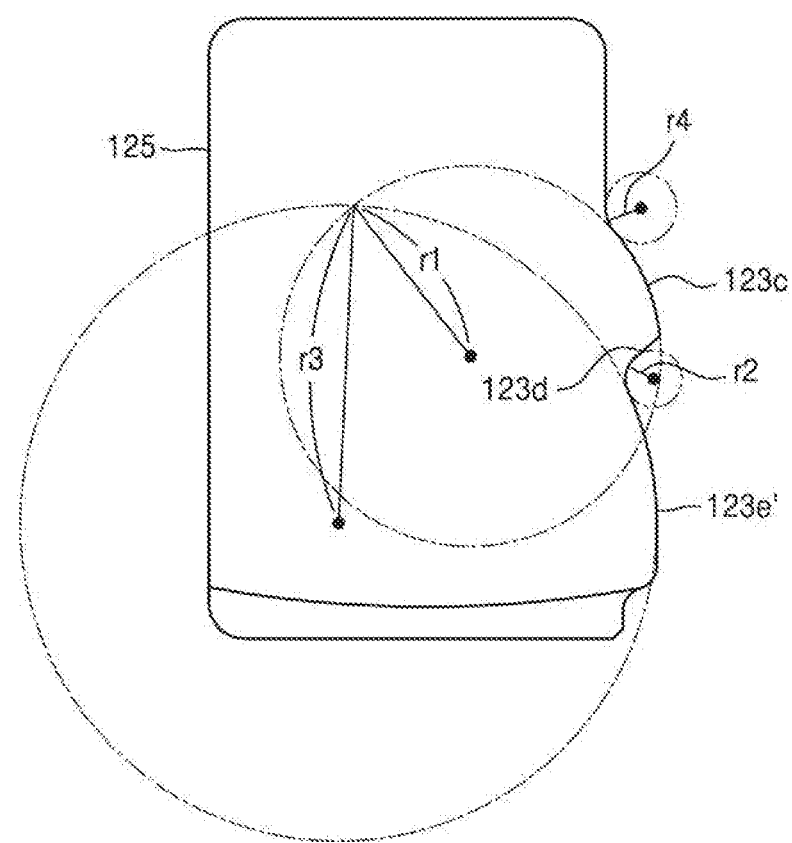

FIGS. 5A through 5C are respectively a front view, a left side view, and a rear view of a memory card 100 according to an embodiment of the inventive concept. FIGS. 6A through 6C are auxiliary views illustrating a structure of the memory card 100 in detail. The memory card 100 according to the embodiment of FIGS. 5A through 5A is the same as the memory card 100 according to the embodiment of FIG. 1, and like reference numerals as those of FIG. 1 are used in order not to hinder clarity of the measurements illustrated in FIGS. 5A through 5C.

Referring to FIG. 1 and FIGS. 5A through 5C, the memory card 100 may have two pairs of edges 121 and 127, and 123 and 125, in which the edges of each pair face each other. The two pairs of edges 121 and 127, and 123 and 125 of the memory card 100 may have an edge 121 at the insertion side where the memory card 100 is inserted into a socket, a first edge 123 and a second edge 125 that adjoin the edge 121 at the insertion side, and a third edge 127 that faces and extends in parallel to the edge 121 at the insertion side. As described above, the second edge 125 may extend in a direction parallel to the edge 121 at the insertion side.

The first edge 123 may have various shapes, and may include two protrusions which are similar in shape to shark fins as illustrated in FIGS. 5A and 5C.

The first edge 123 may include a first portion 123a that extends in parallel to the second edge 125, a first concave portion 123b adjacent to the first portion 123a, a first convex portion 123c adjacent to the first concave portion 123b, a second concave portion 123d adjacent to the first convex portion 123c, and a second convex portion 123e adjacent to the second concave portion 123d.

Here, the portions being adjacent to each other means not only that two adjacent portions are immediately connected to each other but also that portions are continuously formed with an interposing portion included therebetween. Also, a 'concave' segment of the first edge 123 is defined as concave if any two arbitrary points on the segment are connected by a straight line and the straight line is outside the memory card. On the contrary, a 'convex' segment of the first edge 123 is defined as convex if any two arbitrary points on the segment are connected by a straight line and the straight line is on the memory card.

Referring to FIGS. 1 and 5A, the first concave portion 123b and the second concave portion 123d may each include an arc, a center of which is on the opposite side to the memory card 100 with respect to the second edge 123.

Also, the first convex portion 123c and the second convex portion 123e may each include an arc, a center of which is on the side of the memory card 100 with respect to the second edge 123.

When referring to FIG. 6A in order to have a closer look at each portion of the first edge 123, the first edge 123 may have a first portion 123a that extends in parallel to the second edge 125. A length of the first portion 123a is determined according to a position of a latch structure into which the memory card 100 is inserted and coupled, and for example, the length of the first portion 123a may be about 20% to about 40% of a length of the memory card 100 in the first direction.

Also, the first edge 123 may have the first concave portion 123b adjacent to the first portion 123a. The first concave portion 123b is formed such that a straight line connecting any two arbitrary points on the first concave portion 123b is outside the memory card 100.

The first concave portion 123b may include an arc. Selectively, the entire first concave portion 123b may be an arc. However, the first concave portion 123b does not have to be a single arc but may be a combination of one arc and another curved portion or of two or more arcs.

The first concave portion 123b having an arc of a radius of 0.80 is illustrated in FIG. 5A, but the embodiment is not limited thereto.

The first edge 123 may have the first convex portion 123c adjacent to the first concave portion 123b. The first convex portion 123c is formed such that a straight line connecting any two arbitrary points on the first convex portion 123c is on the memory card 100.

The first convex portion 123c may include an arc. Selectively, the entire first convex portion 123c may be an arc. However, the first convex portion 123c does not have to be a single arc but may be a combination of one arc and another curved portion or of two or more arcs.

The first convex portion 123c having an arc of a radius of 3.20 is illustrated in FIG. 5A, but the embodiment is not limited thereto.

Also, while the first concave portion 123b and the first convex portion 123c are directly connected to each other in FIG. 6A, a straight portion may be further interposed therebetween.

The first edge 123 may have the second concave portion 123d adjacent to the first convex portion 123c. The second concave portion 123d is also formed such that a straight line connecting any two arbitrary points on the second concave portion 123d is outside the memory card 100.

The second concave portion 123d may include an arc. Selectively, the entire second convex portion 123d may be an arc. However, the second convex portion 123d does not have to be a single arc but may be a combination of one arc and another curved portion or of two or more arcs.

The second concave portion 123d having an arc of a radius of 0.90 and an arc of a radius of 0.40 is illustrated in FIG. 5A, but the present exemplary embodiment is not limited thereto.

The first edge 123 may include the first convex portion 123e adjacent to the second concave portion 123e. The second convex portion 123e is formed such that a straight line connecting any two arbitrary points on the second convex portion 123e is on the memory card 100.

The second convex portion 123e may include an arc. Selectively, the entire second convex portion 123e may be an arc. However, the second convex portion 123e does not have to be a single arc but may be a combination of one arc and another curved portion or of two or more arcs.

The second convex portion 123e having an arc of a radius of 14.00 is illustrated in FIG. 5A, but the embodiment is not limited thereto.

Also, the first edge 123 may include a second portion 123f that extends in parallel to the second edge 125 between the second concave portion 123d and the second convex portion 123e as illustrated in FIG. 6A. The second portion 123f may extend as a straight line. A length of the second portion 123f may be about 0.1% to about 10% of the length of the memory card 100 in the first direction.

FIGS. 6B and 6C are auxiliary views illustrating arcs included in each convex portion and each concave portion.

Referring to FIGS. 5A and 6B, the first convex portion 123c, the second concave portion 123d, and the second convex portion 123e which are portions of the first edge 123 may respectively include a first arc portion arc1, a second arc portion arc2, and a third arc portion arc3.

A radius of curvature r1 of the first arc portion arc1 included in the first convex portion 123c may be greater than a radius of curvature r2 of the second arc portion arc2 included in the second concave portion 123d. The first convex portion 123c may include two or more arc portions having different radii of curvature. Also, the second concave portion 123d may include two or more arc portions having different radii of curvature.

A curvature center of the first arc portion arc1 may be on the memory card 100. That is, the curvature center of the first arc portion arc1 may be on the same side as the memory card 100 with respect to the first edge 123.

Also, a curvature center of the second arc portion arc2 may be outside the memory card 100. That is, the curvature center of the second arc portion arc2 may be on the opposite side to the memory card 100 with respect to the first edge 123.

The radius of curvature r1 of the first arc portion arc1 may be about three to ten times greater than the radius of curvature r2 of the second arc portion arc2. Also, the radius of curvature r1 of the first arc portion arc1 may be about 10% to about 30% of the length of the memory card 100 in the first direction. Also, the radius of curvature r2 of the second arc portion arc2 may be about 2% to about 15% of the length of the memory card 100 in the first direction.

A radius of curvature r3 of the third arc portion arc3 included in the second convex portion 123e may be greater than the radius of curvature r1 of the first arc portion arc1 included in the first convex portion 123c and the radius of curvature r2 of the second arc portion arc2 included in the second concave portion 123d. The second convex portion 123e may include two or more arc portions having different radii of curvature.

As illustrated in FIGS. 5A and 6D, a curvature center of the third arc portion arc3 may be outside the memory card 100. Selectively, a curvature center of a third arc portion arc3 of a second convex portion 123e' may be on the memory card 100 as illustrated in FIG. 6C. Also, a curvature center of the third arc portion arc3 may be on the same side as the memory card 100 with respect to the first edge 123.

The radius of curvature r3 of the third arc portion arc3 may be about three to eight times greater than the radius of curvature r1 of the first arc portion arc1. Also, the radius of curvature r3 of the third arc portion arc3 may be about 70% to about 200% of the length of the memory card 100 in the first direction.

Referring to FIG. 6A, a circumferential length of the first convex portion 123c may be about 10% to about 30% of the entire external length of the first edge 123. Also, a circumferential length of the second convex portion 123d may be about 3% to about 10% of the entire circumferential length of the first edge 123. Also, a circumferential length of the second convex portion 123e may be about 20% to about 50% of the entire circumferential length of the first edge 123.

In FIG. 6A, the entire circumferential length of the first edge 123 may be a sum of lengths of the first portion 123a, the first concave portion 123b, the first convex portion 123c, the second concave portion 123d, the second portion 123f, and the second convex portion 123e.

Referring to FIGS. 5A and 6A together, the first concave portion 123b may include a fourth arc portion acr4. A radius of curvature r4 of the fourth arc portion arc4 included in the first concave portion 123b may be smaller than the radius of curvature r1 of the first arc portion arc1 included in the first convex portion 123c. The first concave portion 123b may include two or more arc portions having different radii of curvature.

Also, a curvature center of the fourth arc portion arc4 may be outside the memory card 100. In particular, the curvature center of the fourth arc portion arc4 may be on the opposite side to the memory card 100 with respect to the first edge 123.

The radius of curvature r4 of the fourth arc portion arc4 may be about 0.1 to 0.5 times the radius of curvature of the first arc portion arc1. Also, the radius of curvature r4 of the fourth arc portion arc4 may be about 2% to about 5% of the length of the memory card 100 in the first direction.

Also, the first edge 123 may further include a curved segment between the first arc portion arc1 and the second arc portion arc2. The curved segment may include a fifth arc portion arc5. The entire curved segment may be an arc. However, the curved segment does not have to be a single arc but may be a combination of one arc and another curved portion or of two or more arcs.

The first edge 123 may include a first notch portion 150 that is formed by a portion of the first convex portion 123c and the second concave portion 123d. The second arc portion arc2 may be a portion of the first notch portion 150. The first notch portion 150 may operate so as to fix the memory card 100 to a socket when the memory card 100 is inserted into the socket.

Also, the memory card 100 may include a second notch portion 152 at an end of the third edge 127. Although the second notch portion 152 is illustrated as being provided between the first edge 123 and the third edge 127 in FIGS. 2 and 5C, the second notch portion 152 may also be provided between the second edge 125 and the third edge 127.

In particular, the second notch portion 152 may be provided between the third arc portion arc3 and the third edge 127. The second notch portion 152 may be recessed in an L-shape as illustrated in FIGS. 2 and 5C. The second notch portion 152 may include a sixth arc portion arc6.

Referring to FIGS. 5A and 5B, a withdrawal auxiliary portion 160 may be formed on a surface of the memory card 100. The withdrawal auxiliary portion 160 may allow easy withdrawal of the memory card 100 from a socket after the memory card 100 is inserted into the socket. The withdrawal auxiliary portion 160 may be protruded from a surface of the memory card 100. Also, the withdrawal auxiliary portion 160 may be formed adjacent to the third edge 127.

A side of the withdrawal auxiliary portion 160 opposite to the third edge 127 may be formed such that a center of the side in a horizontal direction is concave toward the third edge 127. In particular, the withdrawal auxiliary portion 160 extends along the third edge 127 and a width thereof is varied along the third edge 127, and the width of the withdrawal auxiliary portion 160 may be smallest in a center of the third edge 127. Also, the width of the withdrawal auxiliary portion 160 may be greatest at two ends of the memory card 100. In other words, the width of the withdrawal auxiliary portion 160 may be the greatest at portions adjacent to the first edge 123 and the second edge 125. The width of the withdrawal auxiliary portion 160 may gradually increase from the center of the third edge 127 to the two ends of the third edge 127. By configuring the withdrawal auxiliary portion 160 in this manner, a contact area having characteristics matching with fingers is improved when withdrawing the memory card 100, and thus, the memory card 100 may be easily withdrawn.

Also, as illustrated in FIG. 5A, the withdrawal auxiliary portion 160 may be formed on an opposite surface to the surface where the second row terminals 140 are formed. Furthermore, the passive device 170 may be formed in the withdrawal auxiliary portion 160. The passive device 170 is described above in detail, and thus additional description thereof will be omitted here.

Referring to FIGS. 5B and 5C, the edge 121 at the insertion side may be chamfered. The edge 121 at the insertion side may be chamfered over the width of the memory card 100. The memory card 100 may be further easily inserted via the chamfered portion.

As illustrated in FIGS. 5C and 6A, the first convex portion 123c may be a portion of the protrusion of the first edge 123 together with the second concave portion 123d. In a lateral direction of the first convex portion 123c, in detail, in a lateral direction of the first arc portion arc1, the second row terminals 140 may be formed. Also, a passive device may be formed in the protrusion, and the passive device may be electrically connected to at least one of the second row terminals 140.

Also, as described above with reference to FIGS. 1 through 3, the second row terminals 140 may include the card detection terminal 143 and the second voltage power terminal 141. Furthermore, the card detection terminal 143 and the second voltage power terminal 141 may be connected to each other as a circuit, with the passive device 170 included therebetween.

[Socket Coupling Structure]

Figure 7:
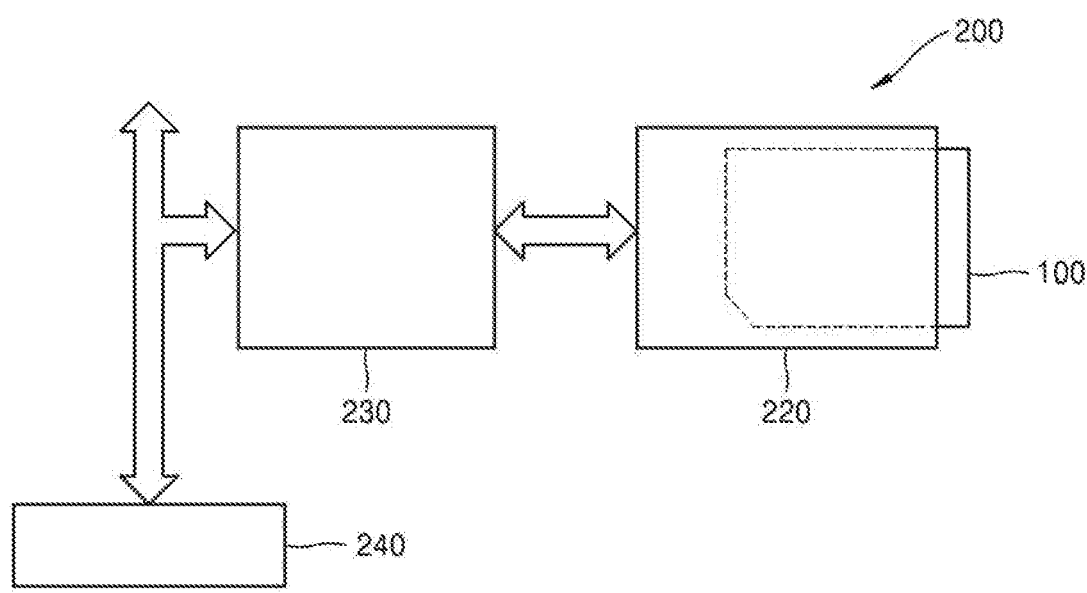
FIG. 7 is a schematic view illustrating a system that uses a memory card according to embodiments of the inventive concept.

FIG. 7 is a schematic view illustrating a system 200 that uses a memory card according to embodiments of the inventive concept.

Referring to FIG. 7, the system 200 includes a socket 220, the memory card 100 described above with reference to the previous embodiments, a card interface controller 230, and a host or an external device 240. The socket 220 may be insertable and contact the memory card 100. The socket 220 may be configured to be electrically connected to the first row terminals 130 and the second row terminals 140 of the memory cards 100, 100a, 100b, 100c, 100d, and 100e illustrated in FIGS. 1, 4A through 4E and FIGS. 5A through 5C. The card interface controller 230 may control data exchange with the memory card 100 via the socket 220. The card interface controller 230 may also be used to store data in the memory card 100. The host 240 may control the card interface controller 230.

Figure 8:
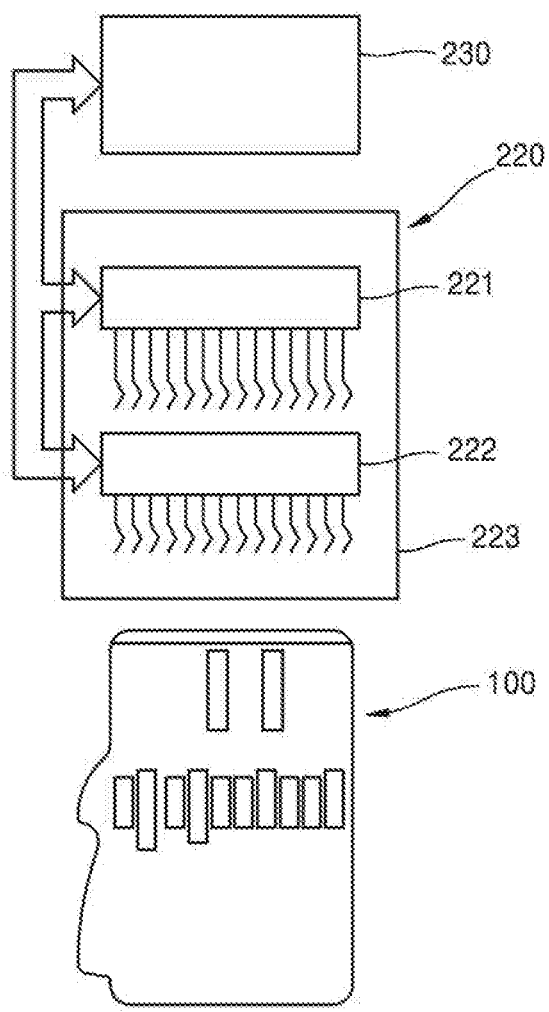
FIG. 8 is a detailed schematic view illustrating a socket of FIG. 7.

FIG. 8 is a detailed schematic view illustrating the socket 220 of FIG. 7 in consideration of electrical connection to the memory card 100.

Referring to FIG. 8, the socket 220 in which the memory cards 100, 100a, 100b, 100c, 100d, and 100e may be inserted is provided.

The socket 220 may include first row-corresponding socket terminals 221 corresponding to the first row terminals 130 of the memory cards 100, 100a, 100b, 100c, 100d, and 100e, second row-corresponding socket terminals 222 corresponding to the second row terminals 140 of the memory cards 100, 100a, 100b, 100c, 100d, and 100e, and a housing 223 accommodating the first row-corresponding socket terminals 221 and the second row-corresponding socket terminals 222.

The memory cards 100, 100a, 100b, 100c, 100d, and 100e may operate by being inserted into the housing 223 to contact the first row-corresponding socket terminals 221 and the second row-corresponding socket terminals 222.

As described with reference to FIG. 7, the socket 220 may be electrically connected to the card interface controller 230 via which power, signals, and/or data may be input to or output from the first row-corresponding socket terminals 221 and the second row-corresponding socket terminals 222.

A socket terminal may be included among the first row-corresponding socket terminals 221 and the second row-corresponding socket terminals 222, wherein the socket is configured such that if a corresponding particular terminal of the inserted memory card 100, 100a, 100b, 100c, 100d, or 100e is a ground terminal, the memory card 100, 100a, 100b, 100c, 100d, or 100e is recognized as a first type card, and if the particular terminal is not a ground terminal, the inserted memory card 100, 100a, 100b, 100c, 100d, or 100e is recognized as a second type card.

While two first row terminals (130) are illustrated in the above embodiments, three or more socket terminals may be included in order that the first row-corresponding socket terminals 221 may recognize a memory card as a second type card. Also, more socket terminals than the number of the second row-corresponding socket terminals 222 may be included so that other card types may also be recognized. It will be obvious to one of ordinary skill in the art that the socket according to the inventive concept is not limited to the number of the illustrated socket terminals.

Figure 9:
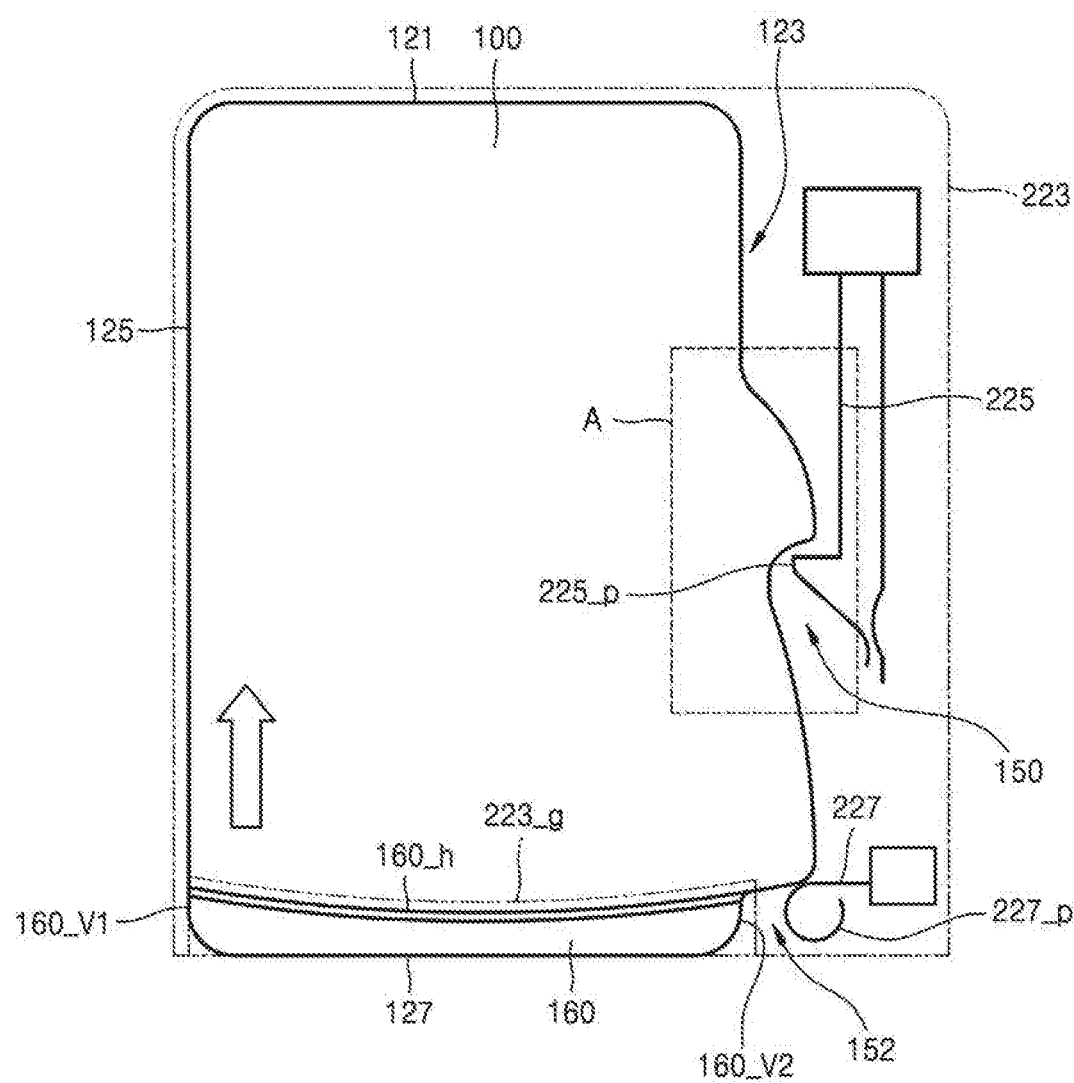
FIG. 9 is a diagram illustrating a coupling manner between a memory card and a socket according to an embodiment of the inventive concept.
Figure 10:
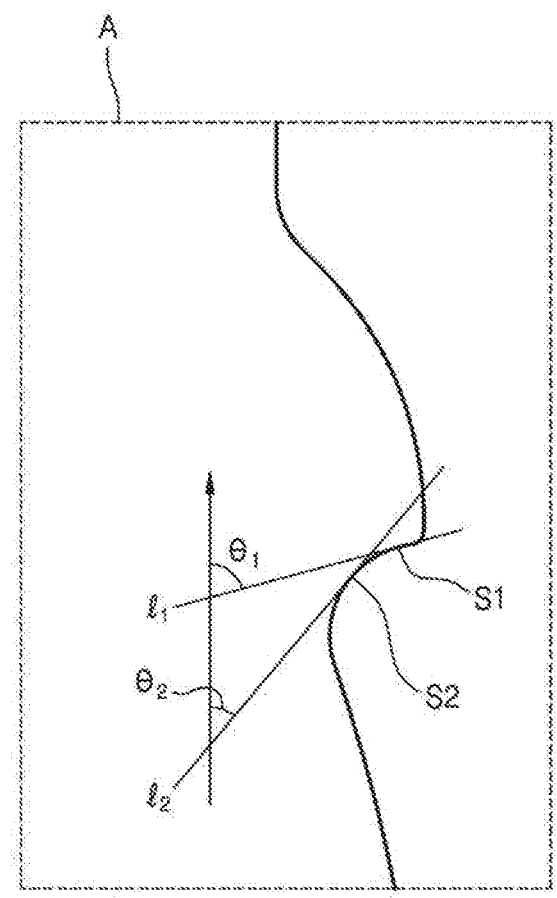
FIG. 10 is a partial expanded view illustrating a first notch portion of the memory card of FIG. 9 in detail.

FIG. 9 is a diagram illustrating a coupling manner between a memory card 100 and a socket according to an embodiment of the inventive concept. FIG. 10 is a partial expanded view illustrating a first notch portion 150 of the memory card 100 of FIG. 9 in detail.

Referring to FIGS. 9 and 10, the memory card 100 may be inserted into the socket in a direction as indicated by a large arrow. The first notch portion 150 may have two or more surfaces S1 and S2 that are not perpendicular to an insertion direction of the memory card 100.

The two or more surfaces S1 and S2 may be planes or portions of a curved surface. As the memory card 100 is inserted, the two or more surfaces S1 and S2 may contact a first elastic body 225 which is used to fix the memory card 100. In detail, the two or more surfaces S1 and S2 may contact a first protrusion 225_p of the first elastic body 225. The memory card 100 may be mated with the socket 220 by the contact.

As illustrated in FIG. 10, the two or more surfaces S1 and S2 may respectively have a first angle s and a second angle an with respect to the insertion direction of the memory card 100.

The first angle θheand the second angle θndmay be different, and in particular, the first angle θaymay be greater than the second angle ay. If the two or more surfaces S1 and S2 are portions of a curved surface, an angle between a normal and the insertion direction of the memory card 100 on the two or more surfaces S1 and S2 may be used.

Also, any of the first angle θlsand the second angle nd is at 90 degrees with respect to the insertion direction of the memory card 100.

At least a portion of the first protrusion 225_p may be inserted into the first notch portion 150 so as to elastically contact the first notch portion 150, thereby fixing the memory card 100 in the housing 223.

The first elastic body 225 may be disposed in a middle portion of the housing 223 in the insertion direction of the memory card 100.

Also, the second notch portion 152 may be coupled to a second elastic body 227 of the socket 220. In particular, the second notch portion 152 may be coupled to a second protrusion 227_p of the second elastic body 227. At least a portion of the second protrusion 227_p may be inserted into the second notch portion 152 so as to elastically contact the second notch portion 152, thereby fixing the memory card 100 in the housing 223.

The second elastic body 227 may be disposed at an entrance of the housing 223.

As a mating between the double notch portions and the protrusions is provided as described above, detachment of the memory card 100 due to an external impact may be prevented. Moreover, each protrusion is aligned in a series to guide the memory card 100 in the mating between the double notch portions and the protrusions, and thus, insertion of the memory card 100 in an incorrect direction may be effectively prevented. Thus, terminals of the memory card 100 may be matched with socket terminals to be in contact with the socket terminals.

Although the first elastic body 225 and the second elastic body 227 are separately illustrated in FIG. 9, they may also be formed as a single elastic body.

As described above with reference to FIGS. 5A and 5B, the withdrawal auxiliary portion 160 may be formed along the third edge 127. The withdrawal auxiliary portion 160 may have a horizontal extension portion 160_h and vertical extension portions 160_v1 and 160_v2. The horizontal extension portion 160_h may be a portion that extends in a width direction of the memory card 100, and does not necessarily have to extend in parallel with the third edge 127.

The vertical extension portions 160_v1 and 160_v2 may be portions that extend from two ends of the horizontal extension portion 160_h in the insertion direction of the memory card 100, and do not necessarily have to extend in parallel with the second edge 125.

Meanwhile, a groove portion 223_g in which the withdrawal auxiliary portion 160 may be accommodated may be formed in the housing 223 accommodating the memory card 100. The groove portion 223_g may have a shape corresponding to the withdrawal auxiliary portion 160 and be configured such that the groove portion 223_g holds the vertical extension portions 160_v1 and 160_v2 of the withdrawal auxiliary portion 160 at two sides. Accordingly, the groove portion 223_g may perform a function of stopping lateral movement of the vertical extension portions 160_v1 and 160_v2.

Furthermore, when the withdrawal auxiliary portion 160 is inserted into the housing 223, the groove portion 223_g may also perform a function of stopping additional entry of the horizontal extension portion 160_h.

As described above, the first notch portion 150 and the second notch portion 152 are included in the memory card 100 in order to fix the memory card 100 to the socket at two points, and the first elastic body 225 and the second elastic body 227 are included in the socket 220, and thus, the memory card 100 may be firmly and stably inserted into the socket 220. Also, the groove portion 223_g which fixes the withdrawal auxiliary portion 160 prevents lateral movement of the memory card 100 so that the terminals of the memory card 100 and the socket terminals are connected without any error.

Figure 11:
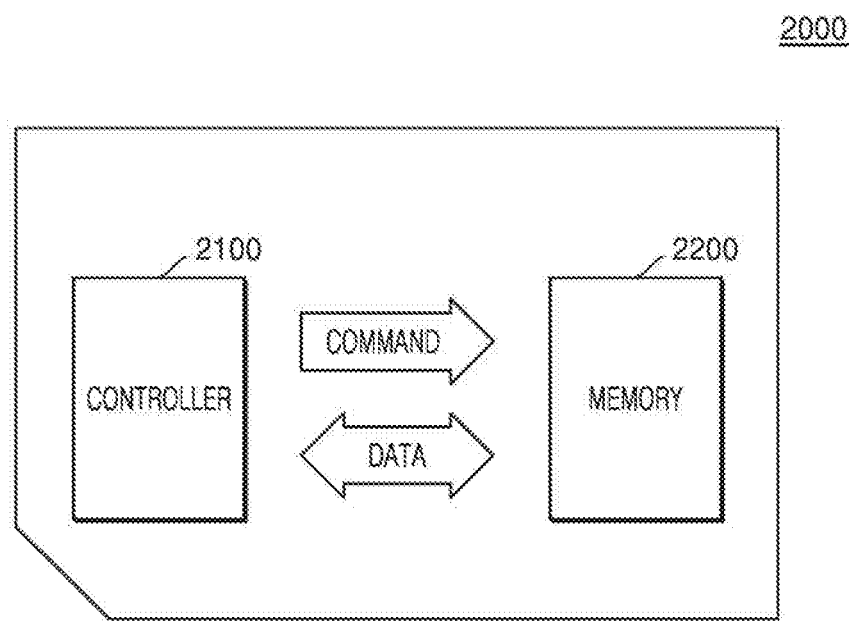
FIG. 11 is a schematic view illustrating a structure of a memory card according to the inventive concept.

FIG. 11 is a schematic view illustrating a structure of a memory card 2000 according to the inventive concept.

In detail, a controller 2100 and a memory 2200 may be configured in the memory card 2000 so as to exchange an electrical signal. For example, if the controller 2100 gives a command, the memory 2200 may transmit data. The memory card 2000 may be the memory cards described above.

Figure 12:
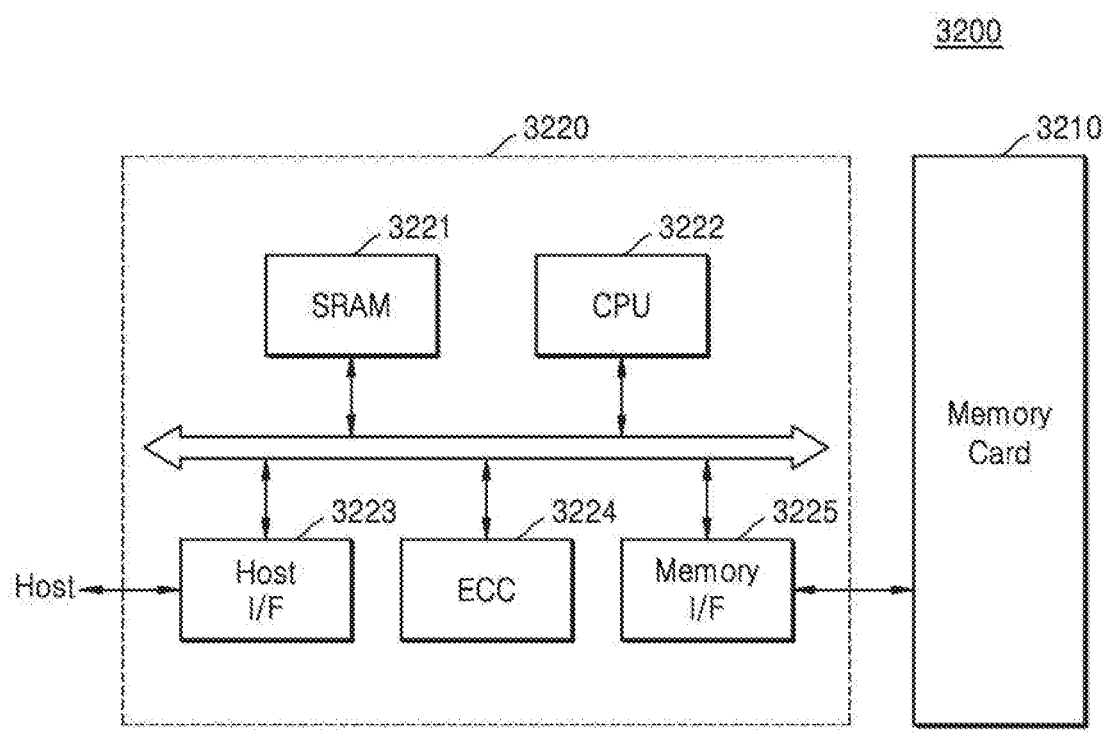
FIG. 12 is a block diagram illustrating a memory device including a memory card according to the inventive concept.

FIG. 12 is a block diagram illustrating a memory device 3200 including a memory card according to the inventive concept.

Referring to FIG. 12, the memory device 3200 according to an embodiment of the inventive concept includes a memory card 3210. The memory card 3210 may include at least one of the memory cards of the above-described embodiments. Also, the memory card 3210 may further include a semiconductor memory device in another form (for example, a non-volatile memory device and/or a static random access memory (SRAM) device). The memory device 3200 may include a memory controller 3220 that controls data exchange between a host and the memory card 3210.

The memory controller 3220 may include a processing unit 3222 that controls an overall operation of the memory device 3200. Also, the memory controller 3220 may include an SRAM 3221 that is used as an operation memory of the processing unit 3222. In addition, the memory controller 3220 may further include a host interface 3223 and a memory interface 3225. The host interface 3223 may include a data exchange protocol between the memory device 3200 and the host. The memory interface 3225 may connect the memory controller 3220 and the memory card 3210. Furthermore, the memory controller 3220 may further include an error correction code (ECC) block 3224. The ECC block 3224 may detect and correct an error of data read from the memory card 3210. Although not illustrated, the memory device 3200 may further include a read only memory (ROM) device that stores code data for interfacing with the host. The memory device 3200 may also be implemented by using a solid state drive (SSD) which may replace a hard disk of a computer system.

Figure 13:
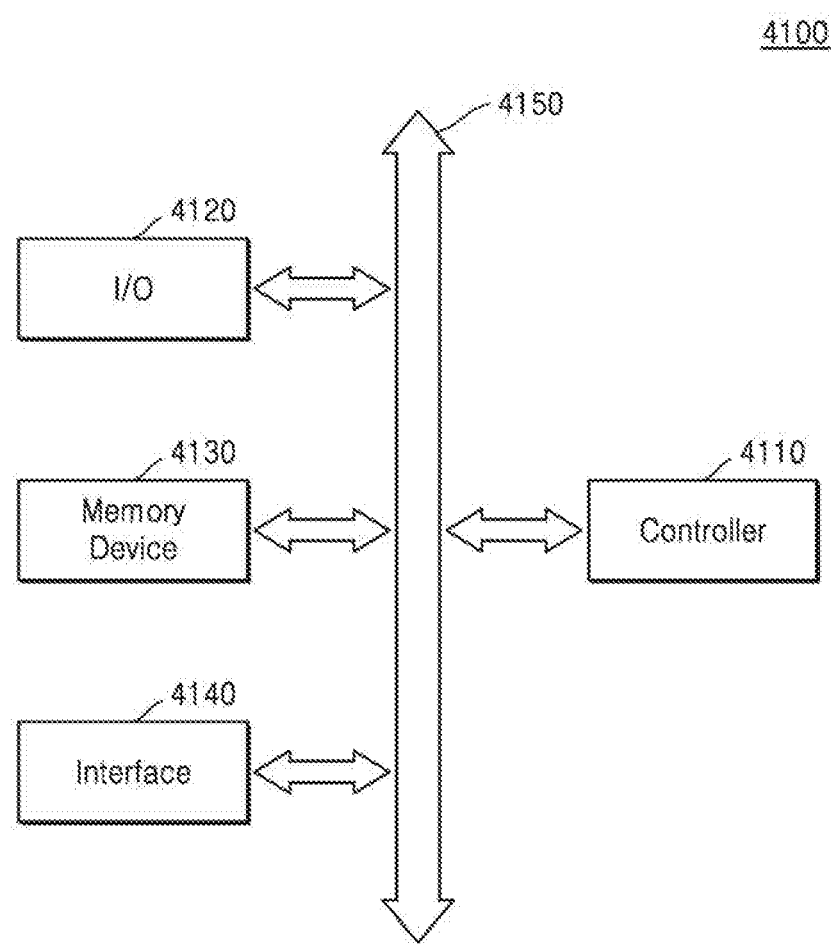
FIG. 13 is a block diagram illustrating an electronic system including a memory card according to the inventive concept.

FIG. 13 is a block diagram illustrating an electronic system 4100 including a memory card according to the inventive concept.

Referring to FIG. 13, the electronic system 4100 may include a controller 4110, an input/output (I/O) device 4210, a memory device 4130, an interface 4140, and a bus 4150. The controller 4110, the input/output device 4120, the memory device 4130, and/or the interface 4140 may be coupled to one another via the bus 4150. The bus 4150 corresponds to a path through which data is transmitted.

The controller 4110 may include at least one of a microprocessor, a digital signal processor, a microcontroller, and logic devices that may perform similar functions of these. The input/output device 4120 may include a keypad, a keyboard, a display device or the like. The memory device 4130 may store data and/or commands. The memory device 4130 may include at least one of the memory cards described in the above embodiments. Also, the memory device 4130 may further include a semiconductor memory device in another form (for example, a non-volatile memory device and/or an SRAM device). Data may be transmitted to or received from a communication network via the interface 4140. The interface 4140 may be in a wired or wireless form.

For example, the interface 4140 may include an antenna or a wired/wireless transceiver. Although not illustrated, the electronic system 4100 may further include, as an operation memory device to improve an operation of the controller 4110, a high-speed dynamic random access memory (DRAM) device and/or an SRAM device.

The electronic system 4100 may be applied to a personal digital assistant (PDA), a portable computer, a web tablet, a wireless phone, a mobile phone, a digital music player, or any electronic products that transmit and/or receive information in a wireless environment.

Figure 14:
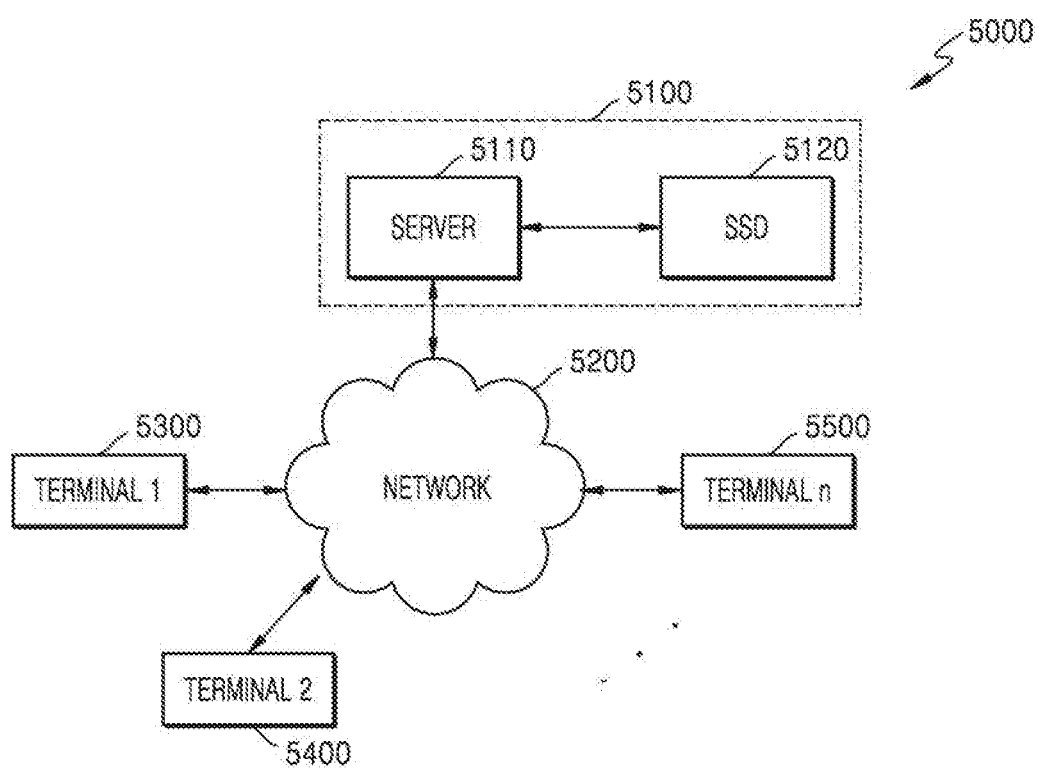
FIG. 14 is a block diagram illustrating an implementation example of a network for a server system that includes an electronic device according to an embodiment of the inventive concept.

FIG. 14 is a block diagram illustrating an implementation example of a network 5200 for a server system 5100 that includes an electronic device according to an embodiment of the inventive concept.

Referring to FIG. 14, a network system 5000 according to an embodiment of the inventive concept may include a server system 5100 and multiple terminals 5300, 5400, and 5500 that are connected via a network 5200. The server system 5100 according to the present embodiment may include a server 5110 that processes requests received from the terminals 5300, 5400, and 5500 connected to the network 5200 and an electronic device 5120 that stores data corresponding to the requests received from the terminals 5300, 5400, and 5500. The electronic device 5120 may include, for example, at least one of the memory cards according to the embodiments illustrated in FIGS. 1, 2, 4A through 4E, 5A through 5C, and 6A through 6C. The electronic device 5120 may be, for example, an SSD.

Meanwhile, the electronic device 5120 according to the inventive concept described above may be mounted using various types of packages. For example, the electronic device 5120 according to the inventive concept may be mounted using packages such as a package on package (POP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), a small outline ingetrated circuit (SOIC), a shrink small outline package (SSOP), a thin small outline package (TSOP), a thin quad flat pack (TQFP), a system in package (SIP), a multi-chip package (MCP), a wafer-level fabricated package (WFP), or a wafer-level processed stack package (WSP).

The memory card according to the embodiments of the inventive concept has not only an excellent design but also allows efficient arrangement of a card detection terminal and a power terminal and a passive device connected to the card detection terminal and the power terminal, thereby maximizing efficient use of an area of the memory card and enabling an electrically stable power supply.

Also, stress applied to the memory card when the memory card is inserted or ejected may be minimized by forming a notch that is coupled to a socket and has a smooth form, thereby further improving stability of the memory card.

While the inventive concept has been particularly shown and described with reference to exemplary embodiments thereof, it will be understood that various changes in form and details may be made therein without departing from the spirit and scope of the following claims.

What is claimed is:

1. A memory card comprising:
   a substrate having two pairs of edges, in which the edges of each pair face each other;
   a plurality of first row terminals that are arranged adjacent to an edge at an insertion side of the substrate; and a plurality of second row terminals that are spaced farther apart from the edge at the insertion side than the plurality of first row terminals, wherein the plurality of second row terminals include a pair of data input terminals and a pair of data output terminals, wherein the pair of data input terminals and the pair of data output terminals are neighboring with a ground terminal intervening between the pair of data input terminals and the pair of data output terminals, wherein the plurality of first row terminals include only a ground terminal and a first voltage power terminal for applying a first voltage, and the plurality of second row terminals include a second voltage power terminal for applying a second voltage, the first voltage being greater than the second voltage, and wherein the first voltage ranges from about 3.0 V to about 3.5 V and the second voltage ranges from about 1.5V to about 2.2 V.

2. The memory card of claim 1, wherein the pair of data input terminals are electrically shielded by a first pair of ground terminals, each of the first pair of ground terminals being positioned at the opposite sides of the pair of data input terminals.

3. The memory card of claim 2, wherein the pair of data output terminals are electrically shielded by a second pair of ground terminals, each of the second pair of ground terminals being positioned at the opposite sides of the pair of data output terminals.

4. The memory card of claim 3, wherein the ground terminal intervening between the pair of data input terminals and the pair of data output terminals is part of both the first pair of ground terminals and the second pair of ground terminals.

5. The memory card of claim 1, wherein a distance between a center of the second row terminals in a direction perpendicular to the edge at the insertion side, which is a first direction, and a center of the memory card is 20% of a length of the memory card in the first direction or less.

6. The memory card of claim 1, wherein the plurality of second row terminals further include a reference clock terminal.

7. The memory card of claim 6, wherein the plurality of second row terminals further include a card detection terminal.

8. The memory card of claim 7, wherein the second voltage power terminal is between the reference clock terminal and the card detection terminal.

9. The memory card of claim 8, further comprising a passive device so that the card detection terminal is positioned between the passive device and the second voltage power terminal.

10. The memory card of claim 9, wherein a first end of the passive device is electrically connected to the second voltage power terminal and a second end of the passive device is electrically connected to the card detection terminal.

11. The memory card of claim 7, wherein the card detection terminal is between the second voltage power terminal and the reference clock terminal.

12. A memory card comprising:
a substrate having a first pair of edges and a second pair of edges, each edge of the first pair of edges extends in a direction that is substantially perpendicular to each edge of the second pair of edges, the first pair of edges including a first edge and a second edge at opposite side from each other, and the second pair of edges including a third edge at insertion side of the memory card from which the memory card is inserted into a socket and a fourth edge located at opposite side from the third edge;

a plurality of first row terminals that are arranged adjacent to an edge at an insertion side of the substrate; and a plurality of second row terminals that are spaced farther apart from the edge at the insertion side than the plurality of first row terminals, wherein the plurality of first row terminals include only a ground terminal and a first voltage power terminal, and wherein the plurality of second row terminals sequentially include a card detection terminal, a second voltage power terminal, a reference clock terminal, a first ground terminal, a first pair of data terminals, a second ground terminal, a second pair of data terminals, and a third ground terminal.

13. The memory card of claim 12, wherein the first pair of data terminals are a pair of data input terminals and the second pair of data terminals are a pair of data output terminals.

14. The memory card of claim 12, wherein the first pair of data terminals are a pair of data output terminals and the second pair of data terminals are a pair of data input terminals.

15. The memory card of claim 12, wherein a distance between the third edge and a front end of the card detection terminal is the same as a distance between the third edge and a front end of the power terminal.

16. The memory card of claim 12, wherein a distance between the third edge and a front end of the card detection terminal is smaller than a distance between the third edge and a front end of the power terminal.

17. A memory card comprising:
a substrate having a first pair of edges and a second pair of edges, each edge of the first pair of edges extends in a direction that is substantially perpendicular to each edge of the second pair of edges, the first pair of edges including a first edge and a second edge at opposite side from each other, and the second pair of edges including a third edge at insertion side of the memory card from which the memory card is inserted into a socket and a fourth edge located at opposite side from the third edge;

a plurality of first row terminals that are arranged adjacent to the third edge; and a plurality of second row terminals that are spaced farther apart from the third edge than the plurality of first row terminals, wherein the first edge includes a first convex portion at a lateral side of the plurality of second row terminals, wherein a passive device is provided in a region defined by the first convex portion, wherein the plurality of first row terminals include only a ground terminal and a first voltage power terminal, wherein the plurality of second row terminals include a card detection terminal and a power terminal at a side closer to the first convex portion, and wherein a first end of the passive device is electrically connected to the power terminal and a second end of the passive device is electrically connected to the card detection terminal.

18. The memory card of claim 17, wherein the first convex portion is in a shape of a shark fin.

* * * * *

UNITED STATES PATENT AND TRADEMARK OFFICE
CERTIFICATE OF CORRECTION

PATENT NO. : 11,043,247 B2
APPLICATION NO. : 16/514364
DATED : June 22, 2021
INVENTOR(S) : Seok-Jae Han et al.

Page 1 of 1

It is certified that error appears in the above-identified patent and that said Letters Patent is hereby corrected as shown below:

On the Title Page

Page 2, right column:
Replace "2011/0021956 A1* 1/2011 Shinomiya", with "2001/0021956 A1* 9/2001 Okamoto et al."

Signed and Sealed this
Seventeenth Day of August, 2021

Drew Hirshfeld
*Performing the Functions and Duties of the
Under Secretary of Commerce for Intellectual Property and
Director of the United States Patent and Trademark Office*